(12) United States Patent
Shimizu

(10) Patent No.: US 10,262,712 B2
(45) Date of Patent: Apr. 16, 2019

(54) MEMORY DEVICE WITH A CONTROL CIRCUIT TO CONTROL DATA READS

(71) Applicant: TOSHIBA MEMORY CORPORATION, Minato-ku, Tokyo (JP)

(72) Inventor: Naoki Shimizu, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 137 days.

(21) Appl. No.: 14/852,398

(22) Filed: Sep. 11, 2015

(65) Prior Publication Data

US 2016/0266804 A1     Sep. 15, 2016

Related U.S. Application Data

(60) Provisional application No. 62/130,479, filed on Mar. 9, 2015.

(51) Int. Cl.
| | | |
|---|---|---|
| *G11C 11/16* | (2006.01) | |
| *G11C 13/00* | (2006.01) | |
| *G06F 13/16* | (2006.01) | |

(52) U.S. Cl.
CPC ........ *G11C 11/1673* (2013.01); *G06F 13/161* (2013.01); *G11C 11/1693* (2013.01); *G11C 13/004* (2013.01); *G11C 13/0061* (2013.01)

(58) Field of Classification Search
CPC ............ G11C 11/1673; G11C 11/1693; G11C 13/004; G11C 13/0061
See application file for complete search history.

(56) References Cited

U.S. PATENT DOCUMENTS

| | | | | |
|---|---|---|---|---|
| 6,615,325 | B2* | 9/2003 | Mailloux | G11C 7/1015 |
| | | | | 365/189.15 |
| 8,867,300 | B2* | 10/2014 | Ueda | G11C 13/0004 |
| | | | | 365/148 |
| 9,177,626 | B2* | 11/2015 | Shimizu | G11C 11/1653 |
| 2013/0223140 | A1 | 8/2013 | Sohn | |
| 2013/0258787 | A1 | 10/2013 | Katayama et al. | |

FOREIGN PATENT DOCUMENTS

JP      2013105514 A      5/2013

\* cited by examiner

*Primary Examiner* — Hoai V Ho
*Assistant Examiner* — Minh Dinh
(74) *Attorney, Agent, or Firm* — Holtz, Holtz & Volek PC

(57) ABSTRACT

According to one embodiment, a memory device includes a memory area; and a control circuit, in response to a first command, configured to read out data from the memory area without outputting the data to a data line, subsequently, in response to a second command, configured to output the data to the data line, if the first command is not received after receiving an active command, in response to the second command, configured to output the data read out from the memory area to the data line.

18 Claims, 20 Drawing Sheets

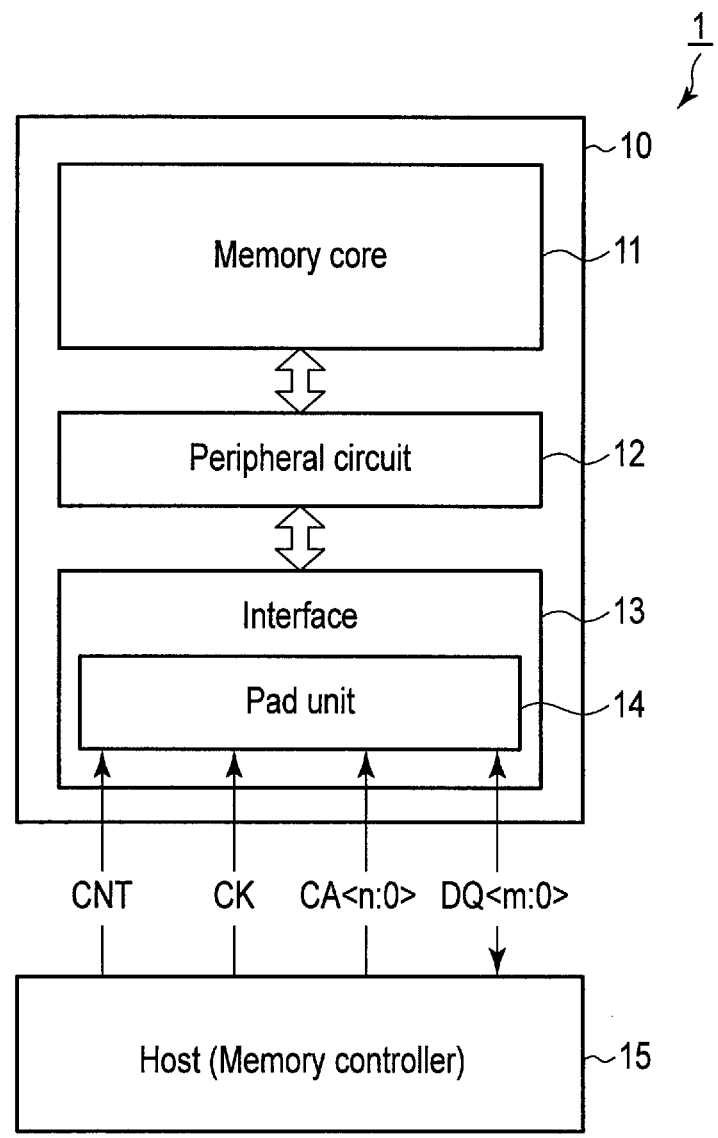
F I G. 1

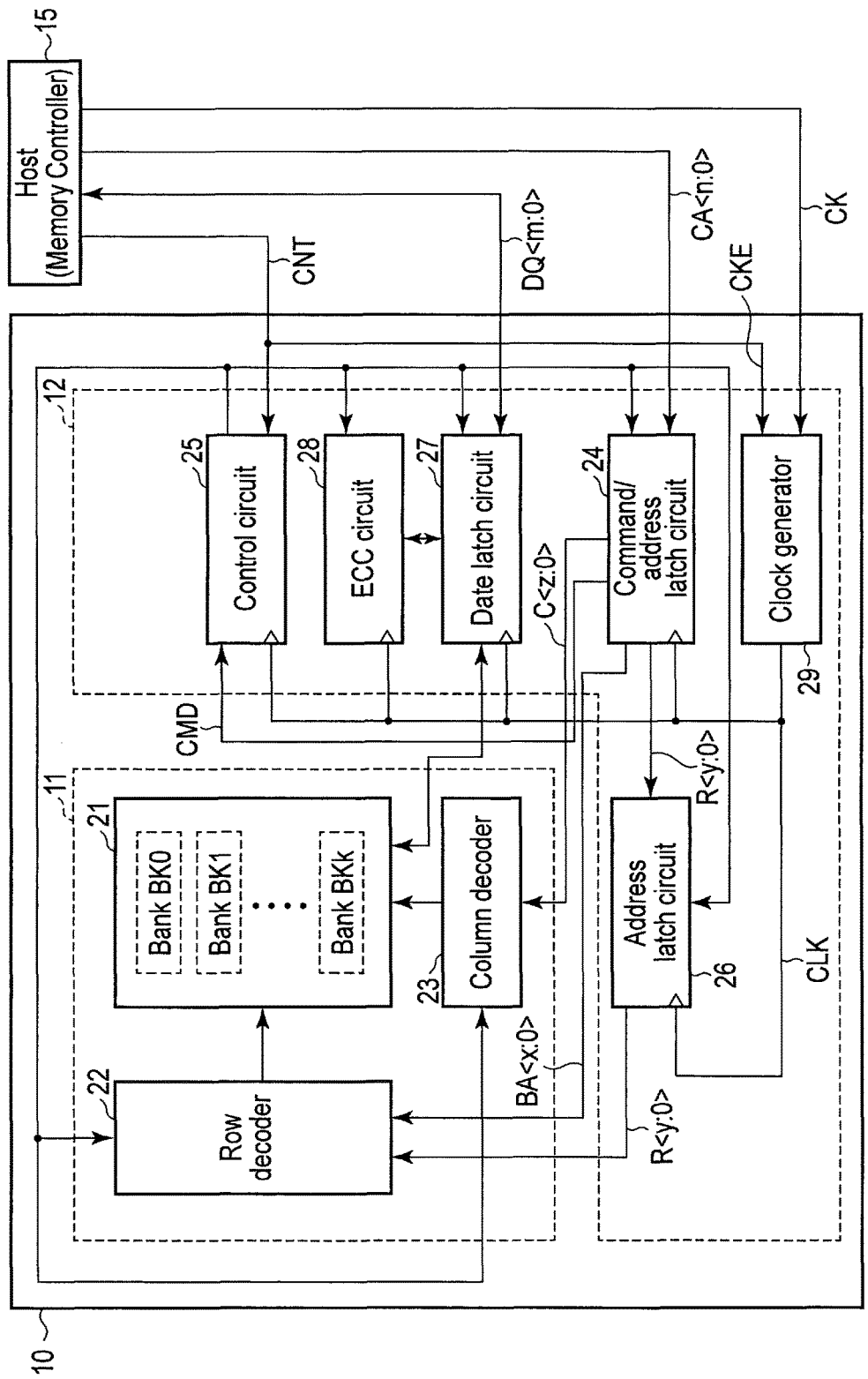
F I G. 2

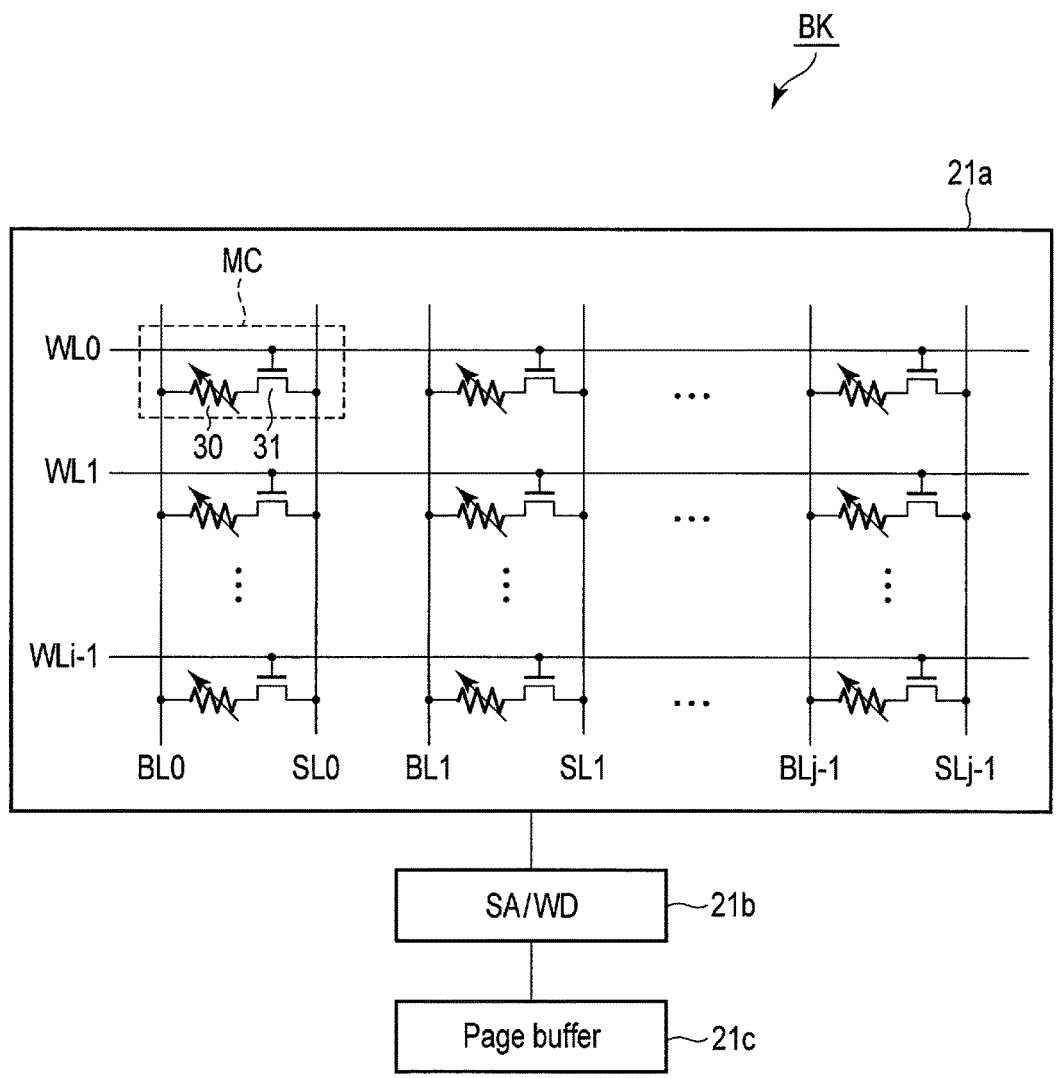
F I G. 3

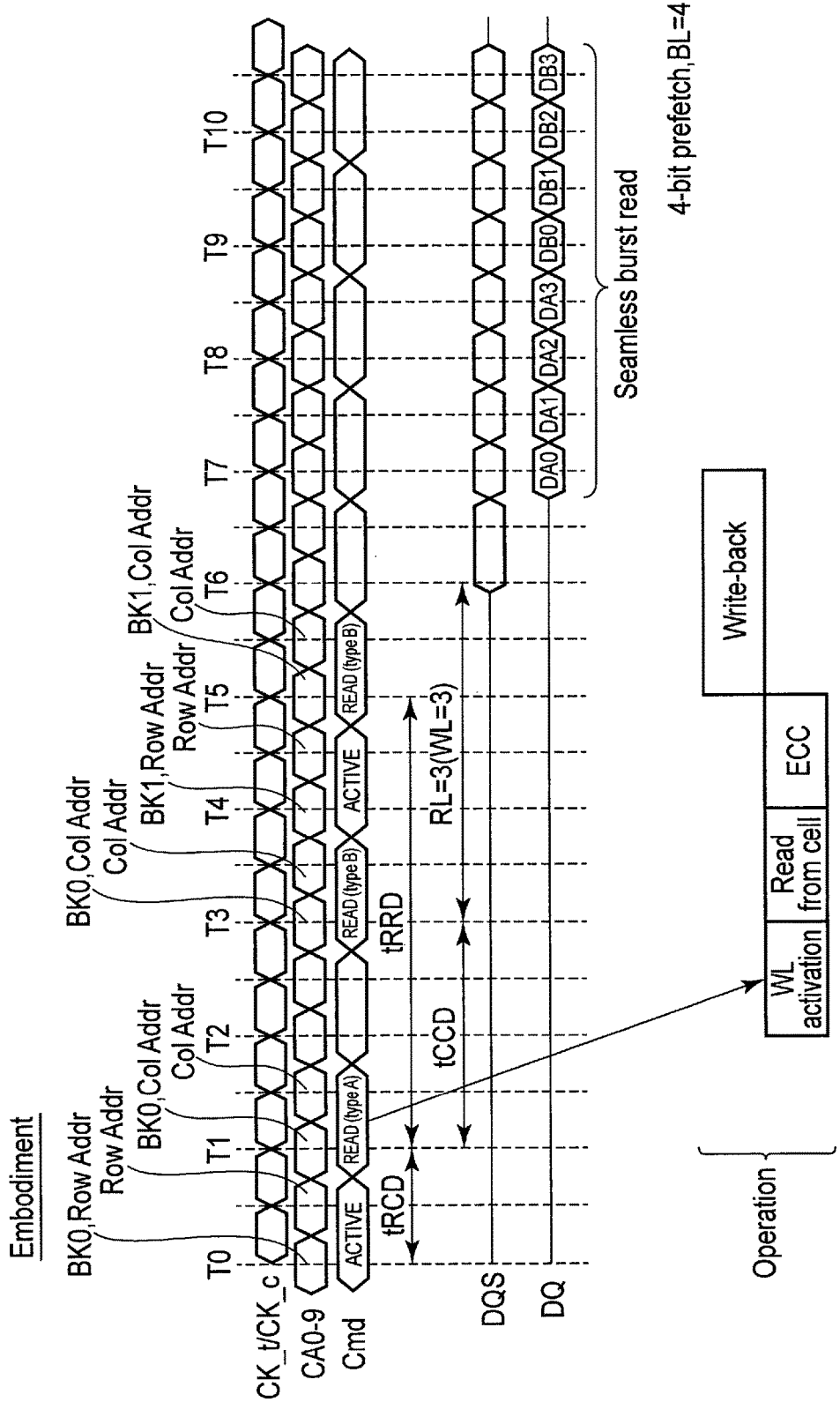
F I G. 4

Comparative example
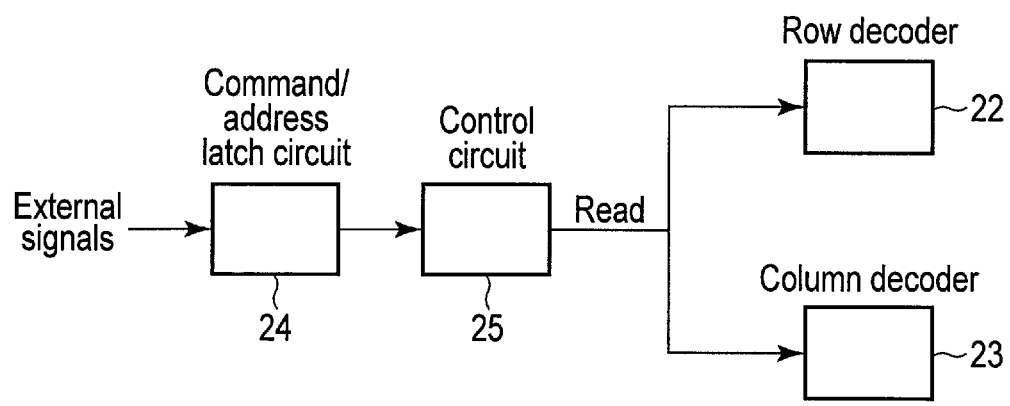
F I G. 9

R<17:0>:Row address
BA<2:0>:Bank address
X:don't care

| CLK | CA0 | CA1 | CA2 | CA3 | CA4 | CA5 | CA6 | CA7 | CA8 | CA9 |
|-----|-----|-----|-----|-----|-----|-----|-----|-----|-----|-----|
| ↑ ACTIVE | L | H | R8 | R9 | R10 | R11 | R12 | BA0 | BA1 | BA2 |
| ↓ | R0 | R1 | R2 | R3 | R4 | R5 | R6 | R7 | R13 | X |

FIG. 11

C<5:1>:Column address
AP:Auto pre-charge ⇨ For post-active

L → type B : C1,2  R14~R17  C3~C6  CLK
H → type A : R14~R17  CLK

Embodiment

| CLK | CA0 | CA1 | CA2 | CA3 | CA4 | CA5 | CA6 | CA7 | CA8 | CA9 |
|-----|-----|-----|-----|-----|-----|-----|-----|-----|-----|-----|
| ↑ READ/WRITE | H | L | L/H | (L/H) | RFU | C1 | C2 | BA0 | BA1 | BA2 |
| ↓ | AP | C3 | C4 | C5 | - | - | R14 | R15 | R16 | R17 |

Both R<17:14> and C<5:1> are always set at the same time if CA3r is L.
Only R<17:14> is set if CA3r is H.

FIG. 12

Comparative Example

| CLK | CA0 | CA1 | CA2 | CA3 | CA4 | CA5 | CA6 | CA7 | CA8 | CA9 |
|---|---|---|---|---|---|---|---|---|---|---|
| ↑ READ/WRITE ↓ | H | L | L/H | RFU | RFU | C1 | C2 | BA0 | BA1 | BA2 |
| | AP | C3 | C4 | C5 | - | - | R14 | R15 | R16 | R17 |

⇦ For post-active

Both R<17:14> and C<5:1> are always set at the same time.

F I G. 13

Embodiment

|  | CS_n | ACT_n | RAS_n /A16 | CAS_n /A15 | WE_n /A14 |
|---|---|---|---|---|---|
| READ (type A) | L | H | L | H | H |
| ACTIVE | L | L | A16 | A15 | A14 |
| WRITE | L | H | H | L | L |
| READ (type B) | L | H | H | L | H |

Both row addresses and column addresses are always
set at the same time with READ (type B) command.
Only row address are set with READ (type A) command.

F I G. 14

Comparative example

|  | CS_n | ACT_n | RAS_n /A16 | CAS_n /A15 | WE_n /A14 |
|---|---|---|---|---|---|
| RFU | L | H | L | H | H |
| ACTIVE | L | L | A16 | A15 | A14 |
| WRITE | L | H | H | L | L |
| READ | L | H | H | L | H |

Both row addresses and column addresses are always set at the same time.

F I G. 15

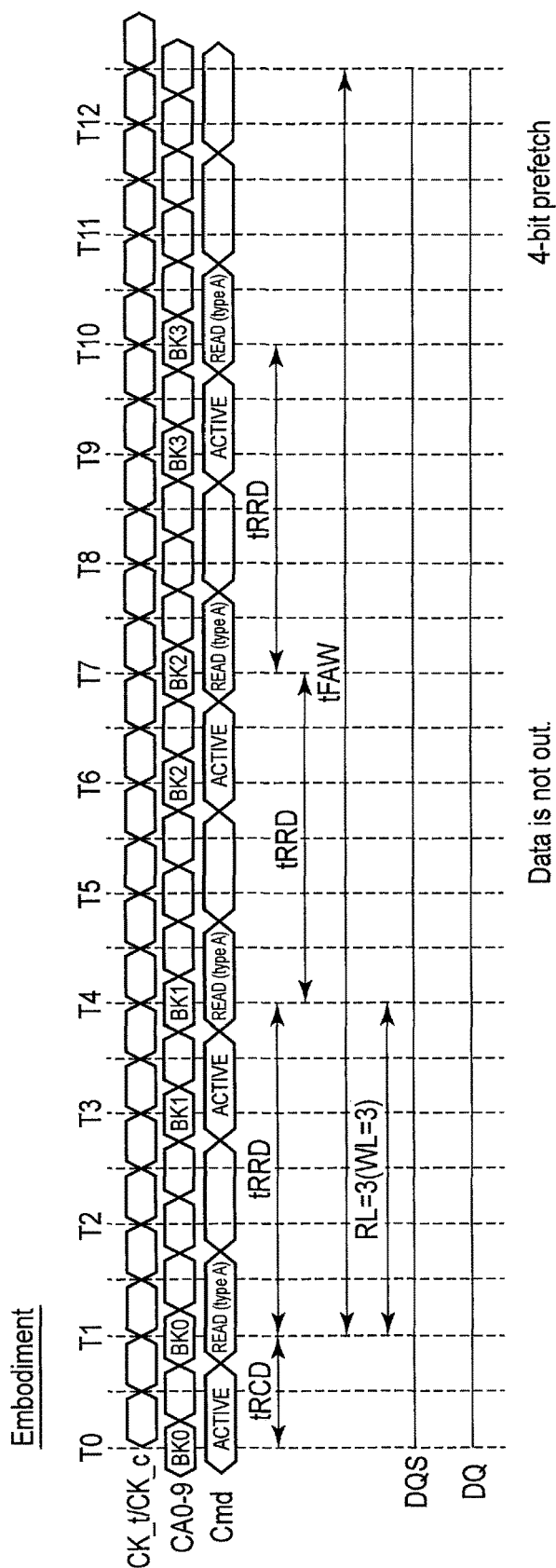
F I G. 17

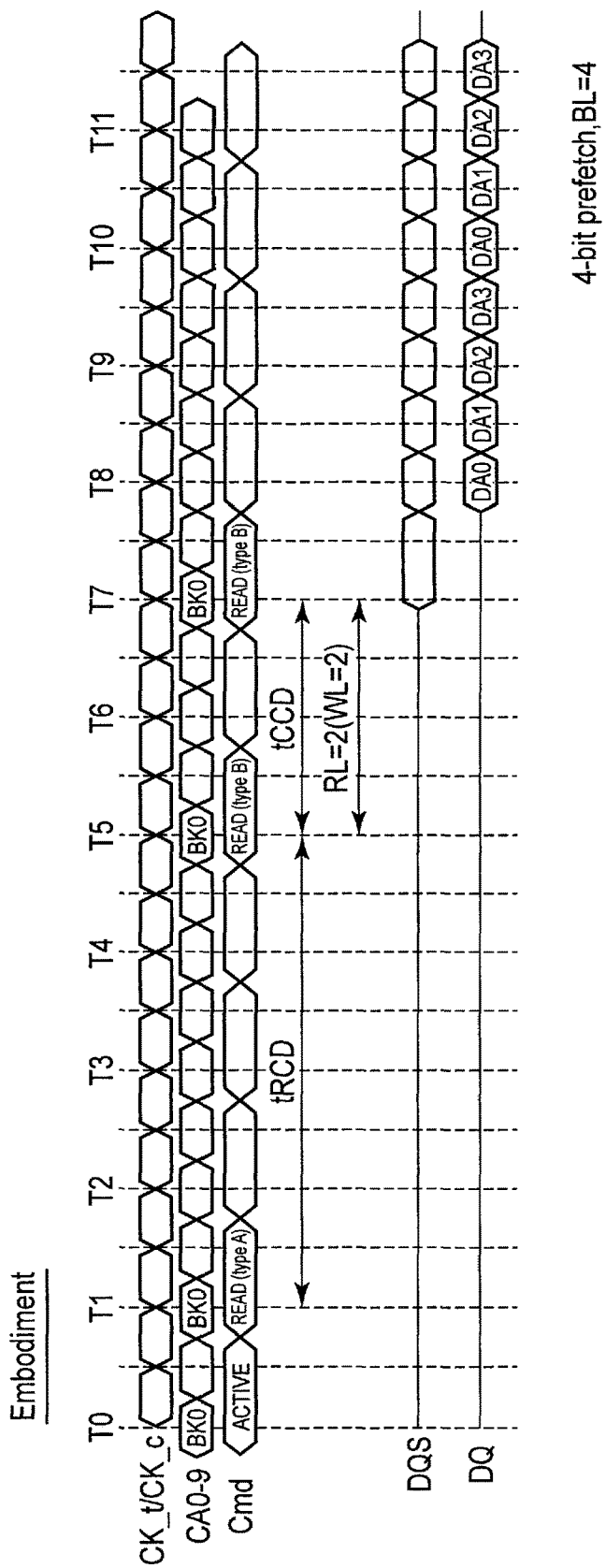
F I G. 19

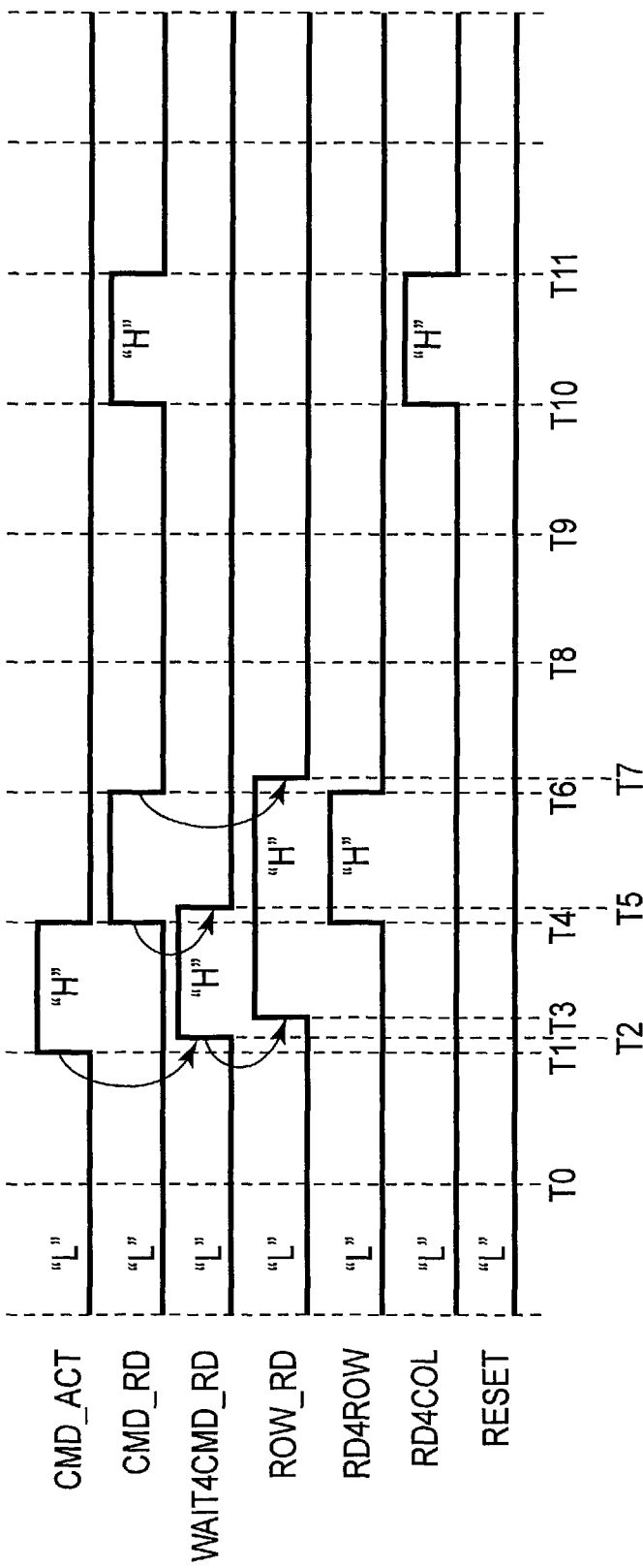
F I G. 23

MEMORY DEVICE WITH A CONTROL CIRCUIT TO CONTROL DATA READS

CROSS REFERENCE TO RELATED APPLICATIONS

This application claims the benefit of U.S. Provisional Application No. 62/130,479, filed Mar. 9, 2015, the entire contents of which are incorporated herein by reference.

FIELD

Embodiments described herein relate generally to a memory device.

BACKGROUND

An MRAM (Magnetic Random Access Memory) is a memory device which uses a magnetic element having the magnetoresistive effect as a memory cell for storing information, and is attracting attention as a next-generation memory device characterized by a high-speed operation, large capacity, and nonvolatility. The MRAM has been studied and developed as a replacement for a volatile memory such as a DRAM or SRAM. In this case, to suppress the development cost and smoothly implement replacement, it is desirable to operate the MRAM according to the same specification as that of the DRAM or SRAM.

BRIEF DESCRIPTION OF THE DRAWINGS

FIG. 1 is a schematic block diagram showing a memory system according to the first embodiment;

FIG. 2 is a block diagram showing examples of the memory core and peripheral circuit of the memory system according to the first embodiment;

FIG. 3 is a circuit diagram showing a memory cell array included in one bank of the memory system according to the first embodiment;

FIG. 4 is a view showing the command sequence of the read operation of the memory system according to the first embodiment;

FIG. 9 is a block diagram showing a signal flow from when an external signal is received until a row decoder and a column decoder are controlled;

FIG. 11 is a table showing a command truth table according to the first specification;

FIG. 12 is a table showing another command truth table according to the first specification;

FIG. 13 is a table showing still another command truth table according to the first specification;

FIG. 14 is a table showing a command truth table according to the second specification;

FIG. 15 is a table showing another command truth table according to the second specification;

FIG. 17 is a view showing the command sequence of the read operation of the memory system according to the first embodiment;

FIG. 19 is a view showing the command sequence of the read operation of the memory system according to the first embodiment;

FIG. 23 is a timing chart showing an example of the operation of the command determination circuit of the memory system according to the third embodiment.

DETAILED DESCRIPTION

Figure 5:
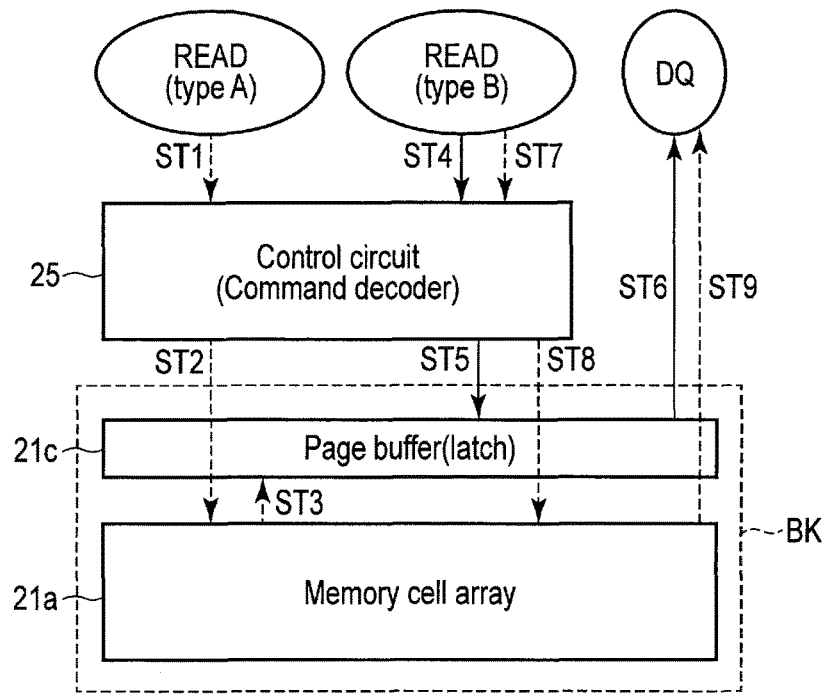
FIG. 5 is a block diagram showing the read operation of the memory system according to the first embodiment.

In general, according to one embodiment, a memory device includes a memory area; and a control circuit, in response to a first command, configured to read out data from the memory area without outputting the data to a data line, subsequently, in response to a second command, configured to output the data to the data line, if the first command is not received after receiving an active command, in response to the second command, configured to output the data read out from the memory area to the data line.

Embodiments will be described below with reference to the accompanying drawings. Common reference numerals denote common parts throughout the drawings in this description.

[1] First Embodiment

[1-1] Memory System 1

A memory system 1 according to the first embodiment will be explained first. As shown in FIG. 1, the memory system 1 includes a semiconductor memory device 10 and a host (or memory controller) 15. The semiconductor memory device 10 according to this embodiment is, for example, an STT-MRAM (Spin Transfer Torque Magnetoresistive Random Access Memory).

As shown in FIG. 1, the semiconductor memory device 10 includes a memory core 11, a peripheral circuit 12, and an interface 13.

The memory core 11 includes a plurality of memory cells each for storing data. The peripheral circuit 12 writes/reads data in/from the memory core 11.

The interface 13 includes a pad unit 14 for receiving commands, addresses, data, and the like. The pad unit 14 includes a plurality of pads. The interface 13 receives, from the host 15 via the pad unit 14, a control signal CNT for read/write, and a clock CK for controlling the read/write operation timing. The interface 13 is connected to the host 15 via the pad unit 14 by a command/address line CA<n:0> and a data line DQ<m:0> where n and m are natural numbers.

The control signal CNT includes a clock enable signal CKE and a chip select signal CS. The clock CK is used to control the operation timing of the semiconductor memory device 10. The command/address line CA<n:0> is used to transmit/receive a command and address. The data line DQ<m:0> is used to transmit/receive data between the semiconductor memory device 10 and the host 15.

Furthermore data line DQ may be used to transmit/receive data between the memory system 1 and an external.

[1-2] Semiconductor Memory Device 10

[1-2-1] Memory Core 11

The memory core 11 of the semiconductor memory device 10 will be described with reference to FIG. 2. The memory core 11 includes a memory area 21, a row decoder 22, and a column decoder 23. The memory area 21 includes (k+1) banks BK0 to BKk where k is a natural number. For example, these banks BK0 to BKk can be individually activated. Note that if the banks BK0 to BKk are not discriminated, they will be simply referred to as banks BK hereinafter.

The row decoder 22 decodes, for example, a bank address BA<x:0> for selecting one of the banks BK0 to BKk and a row address R<y:0> for selecting a row in the selected bank.

The column decoder 23 decodes, for example, a column address C<z:0> for selecting a column in the memory area 21.

[1-2-2] Peripheral Circuit 12

The peripheral circuit 12 of the semiconductor memory device 10 will be described with reference to FIG. 2. The peripheral circuit 12 includes a command/address latch circuit 24, a control circuit 25, an address latch circuit 26, a data latch circuit 27, an ECC (Error Checking and Correcting) circuit 28, and a clock generator 29.

The command/address latch circuit 24 receives a command CMD and an address ADD from the host 15 via the command/address line CA<n:0>, and temporarily stores them. The command CMD is sent to the control circuit 25.

The control circuit 25 controls the operation of the semiconductor memory device 10 based on the control signal CNT and command CMD from the host 15.

Of the address ADD, the bank address BA<x:0> is sent to the row decoder 22, the row address R<y:0> is sent to the address latch circuit 26, and the column address C<z:0> is sent to the column decoder 23.

Note that when a "PRECHARGE" command is input to the command/address latch circuit 24 as the command CMD, the selected bank is set in the initial state (precharge state) for a read operation or write operation. More specifically, at the time of a precharge operation, all word lines, all bit lines, and all source lines are deactivated. When an "ACTIVE" command and "READ (type A)" command are input to the command/address latch circuit 24 as the command CMD, one of the plurality of word lines is activated before reading out data from the memory cell array of the selected bank.

The data latch circuit 27 temporarily stores input data input from the host 15 via the data line DQ<m:0> and output data read out from the selected bank. The input data is written in the selected bank.

At the time of writing data, the ECC circuit 28 generates a parity bit (error correction code) for data to be written in the data latch circuit 27, and adds the parity bit to the data to be written. The data added with the parity bit is written in the memory cell array.

At the time of a data read operation, the ECC circuit 28 performs ECC processing for the data output from the memory cell array to the data latch circuit 27. The ECC circuit 28 performs ECC processing using the parity bit to check whether there is an error in the data from the memory cell array. If an error is detected in the data, the ECC circuit 28 corrects the detected error. The control circuit 25 then writes back the error-corrected data into the memory cell array. In this embodiment, the operation of writing back the error-corrected data obtained by performing the ECC processing into the memory cell array will be referred to as a write-back operation hereinafter. For example, if an error is not detected in the data output from the memory cell array, the semiconductor memory device 10 according to this embodiment executes no write-back operation. The write-back operation ensures the reliability of the data stored in the semiconductor memory device 10. Note that the ECC circuit 28 may be provided in the memory area 21 (bank BK).

The clock generator 29 generates an internal clock CLK based on the clock CK from the host 15. The internal clock CLK is input to the command/address latch circuit 24, control circuit 25, address latch circuit 26, and data latch circuit 27. The internal clock CLK is used to control the operation timings of these components.

[1-2-3] Bank BK

Each bank BK in the memory area 21 will be described with reference to FIG. 3. The bank BK includes a sense amplifier/write driver (SA/WD) 21b, a page buffer 21c, and a memory cell array 21a.

The sense amplifier/write driver 21b is arranged in the bit line direction of the memory cell array 21a. The sense amplifier/write driver 21b includes a sense amplifier and write driver. The sense amplifier is connected to bit lines BL, and detects a current flowing through memory cells MC connected to selection word lines WL to read out data stored in the memory cells MC. The write driver is connected to the bit lines BL, and writes data by making a current flow through the memory cells MC connected to the selection word lines WL. The sense amplifier/write driver 21b controls the bit lines BL and source lines SL based on a control signal from the control circuit 25. Data are exchanged between the sense amplifier/write driver 21b and a data line DQ via the data latch circuit 27.

The page buffer 21c temporality holds data read out from the memory cell array 21a or data received from the host 15. Data are written in the memory cell array 21a for each of column addresses (CA unit). Data are read to page buffer, or written back in the memory cell array 21a for each of pages. Data are output to data line DQ for each of column addresses. A unit of data collectively written in the memory cell array 21a will be referred to as a "page". The page buffer 21c according to this embodiment is provided for each bank BK, and has a memory capacity capable of temporarily storing data of all the pages of the bank BK.

When writing data in the memory cell array 21a, the host 15 transmits a column address indicating a writing destination and write data to the semiconductor memory device 10 together with a write command. The control circuit 25 stores the write data received from the host 15 in the page buffer 21c, and writes, in the memory cell MC designated by the column address, the write data stored in the page buffer 21c.

When reading out data from the memory cell array 21a, the host 15 transmits a column address indicating a read destination to the semiconductor memory device 10 together with a read command. The control circuit 25 reads out data from all column addresses in a page into the page buffer 21c.

The memory cell array 21a is formed by arraying the plurality of memory cells MC in a matrix. A plurality of word lines WL0 to WLi−1, a plurality of bit lines BL0 to BLj−1, and a plurality of source lines SL0 to SLj−1 are disposed in the memory cell array 21a. One row of the memory cell array 21a is connected to one word line WL, and one column of the memory cell array 21a is connected to a pair of the bit line BL and source line SL.

Each memory cell MC is formed from a magnetoresistive effect element (MTJ (Magnetic Tunnel Junction) element) 30 and a selection transistor 31. The selection transistor 31 is formed from, for example, an N-channel MOSFET.

One terminal of the MTJ element 30 is connected to the corresponding bit line BL, and the other terminal of the MTJ element 30 is connected to the drain (source) of the selection transistor 31. The gate of the selection transistor 31 is connected to the corresponding word line WL, and the source of the selection transistor 31 is connected to the corresponding source line SL.

Note that the above-described arrangement of the bank BK is an example, and the bank BK may have another arrangement.

[1-3] Read Operation

[1-3-1] Read Operation of Embodiment

The overview of a read operation according to this embodiment will be described.

The semiconductor memory device 10 according to this embodiment performs two kinds of read operations for the selected bank. More specifically, the two kinds of read operations are an internal read operation of reading out data stored in the memory cell array into the page buffer in the selected bank, and an external read operation of externally reading out data in the selected bank.

Note that the internal read operation and external read operation will be described in detail below. For the sake of simplicity, the internal read operation will also be referred to as the first read operation (type A) or the like hereinafter. The external read operation will also be referred to as the second read operation (type B) or the like hereinafter.

The read operation according to this embodiment will be described in detail with reference to FIG. 4. FIG. 4 shows an example in which data are read out from a predetermined column address of the bank BK0 and data are sequentially read out from a predetermined column address of the bank BK1. Note that the control circuit 25 controls the read operation to be described below.

The semiconductor memory device 10 according to this embodiment operates in synchronism with the timing of the internal clock CLK (clock CK_t and complementary clock CK_c). The semiconductor memory device 10 receives an address and the like from the host 15 when the clock CK_t and complementary clock CK_c intersect each other.

As shown in FIG. 4, at time T0, the semiconductor memory device 10 receives an "ACTIVE" command associated with the bank BK0 from the host 15. Note that at the timings of the rising edge and falling edge of the clock CK_t when the "ACTIVE" command is input, a bank address BA<2:0> and a lower row address R<13:0> are input from the host 15. Then, the bank address BA<2:0> and the lower row address R<13:0> are set in the semiconductor memory device 10.

Furthermore, at time T1 when a period "tRCD (RAS to CAS delay)" elapses after time T0, the semiconductor memory device 10 receives a "READ (type A)" command associated with the bank BK0 from the host 15 subsequently to the "ACTIVE" command. Note that in the first read operation (type A), a read operation is designated at the rising edge of the clock CK_t when the "READ (type A)" command is input, and a post-active operation is designated at the falling edge of the clock CK_t. That is, when the "READ (type A)" command is input, the semiconductor memory device 10 performs a read operation and post-active operation. The post-active operation indicates the start operation (the rise of the word line WL) of the read operation from the memory cell.

In the read operation and post-active operation, the bank address BA<2:0>, a column address C<5:1>, and an upper row address R<17:14> are input from the host 15. Then, the bank address BA<2:0> and upper row address R<17:14> are set in the semiconductor memory device 10. Note that when the "READ (type A)" command is input, the column address C is also input but is not set in the column decoder 23, as will be described later. The period "tRCD" (RAS to CAS delay) shown in FIG. 4 indicates a period from when the "ACTIVE" command is accepted until the "READ" command (or "WRITE" command) is accepted. Also, "RAS" indicates a row address strobe, and "CAS" indicates a column address strobe.

In the semiconductor memory device 10 according to this embodiment, the row address R includes, for example, 18 bits (R<17:0>). Since the MRAM includes a small number of column addresses for selecting pages, as compared with the DRAM, the size of pages is small. Therefore, the semiconductor memory device 10 using the MRAM needs to perform an input operation twice to input the row address R in the semiconductor memory device 10 (by, for example, dividing the row address into the upper bits R<17:14> and lower bits R<13:0>).

At time T3 when a period "tCCD (CAS to CAS delay)" elapses after time T1, the semiconductor memory device 10 receives a "READ (type B)" command associated with the second read operation (type B) of the bank BK0 from the host 15. Note that in the second read operation (type B), a read operation is designated at the rising edge of the clock CK_t when the "READ (type B)" command is input and a post-active operation is designated at the falling edge of the clock CK_t. That is, the "READ (type B)" command can set a read operation and post-active operation. In the read operation and post-active operation, the bank address BA<2:0>, the upper row address R<17:14>, and the column address C<5:1> are input from the host 15. Then, the bank address BA<2:0>, the upper row address R<17:14>, and the column address C<5:1> are set in the semiconductor memory device 10. Note that the period "tCCD (CAS to CAS delay)" shown in FIG. 4 indicates a delay time from when the "READ" command (or "WRITE" command) is accepted until the "READ" command (or "WRITE" command) is accepted.

At time T4, the semiconductor memory device 10 receives an "ACTIVE" command associated with the bank BK1 from the host 15. The semiconductor memory device 10 performs, for the bank BK1, the same operation as that described at time T0.

At time T5 when a period "tRRD" elapses after time T1, the semiconductor memory device 10 receives a "READ (type B)" associated with the bank BK1 from the host 15 subsequently to the "ACTIVE" command. Note that the period "tRRD (Active bank to Active bank)" shown in FIG. 4 is a delay time from when the "all Row addresses" are accepted until the all Row addresses are accepted.

The semiconductor memory device 10 performs, for the bank BK1, the same operation as that described at time T3.

At time T6 when a read latency RL (RL=3) elapses after time T3, the control circuit 25 starts a data line strobe DQS. At time T7, the column decoder 23 outputs some column address data (DA0 to DA3) of the data stored in the page buffer 21c to the data line DQ. Note that the read latency RL is the time required to start the data line strobe DQS for outputting the read data to the data line DQ after a read request is started. When a preparation time (tDQSCK) for data called a preamble elapses after the read latency RL elapses, the read data appear on the data line DQ. In this embodiment, the read latency RL is generated not after the "READ (type A)" command is issued but after the "READ (type B)" command is issued.

After the data (DA0 to DA3) associated with the bank BK0 are output (time T9), when the data line strobe DQS (to be described later) starts, the column decoder 23 associated with the bank BK1 supplies, to the data line DQ, some column address data (DB0 to DB3) of the data stored in the page buffer 21c associated with the bank BK1.

As described above, in the read operation according to this embodiment, it is possible to seamlessly output, to the data line DQ, the data (DA0 to DA3) stored in the memory cell array 21a of the bank BK0 and the data (DB0 to DB3) stored in the memory cell array 21a of the bank BK1.

[1-3-1-1] First Read Operation (Type A)

The first read operation (type A) will be described with reference to FIG. 5.

As shown in FIG. 5, upon receiving the "READ (type A)" command from the host 15 (ST1), the control circuit 25 reads out all data in a page on a selected row from the memory cell array 21a to the page buffer 21c based on the row address R (ST2 and ST3). At this time, the readout data are stored in the page buffer 21c. In the first read operation (type A) based on the "READ (type A)" command, no data are output to the data line DQ. The operation in which data are read out from the memory cell array 21a to the page buffer 21c and are not output to the data line DQ will be referred to as the first read operation (type A) (internal read operation) hereinafter.

The operation of the control circuit 25 when the "READ (type A)" command is input to the semiconductor memory device 10 will be schematically described with reference to FIG. 6.

Figure 6:
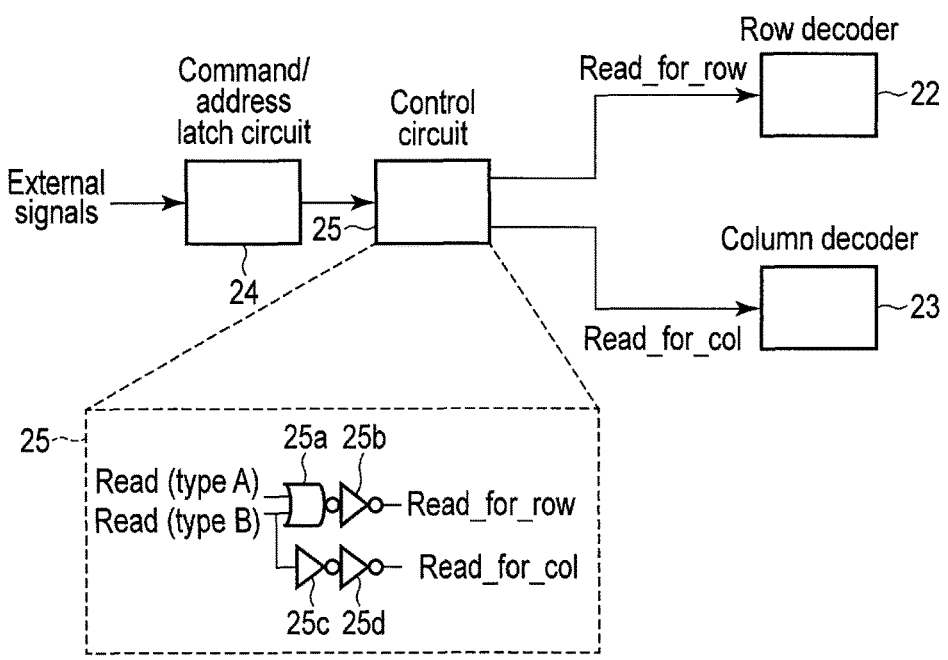
FIG. 6 is a block diagram showing a signal flow from when an external signal is received until a row decoder and a column decoder are controlled.

As shown in FIG. 6, the "READ (type A)" command is input to the control circuit 25 from the host 15 via the command/address latch circuit 24. The command decoder of the control circuit 25 decodes the first read operation (type A). The command decoder outputs a signal at "H" level to the first input terminal of a NOR circuit 25a of the control circuit 25.

Note that at the time of the first read operation (type A), the command decoder sets the voltage of the second input terminal of the NOR circuit 25a of the control circuit 25 at "L" level.

Consequently, the NOR circuit 25a receives a signal at "H (High)" level at the first input terminal, and a signal at "L (Low)" level at the second input terminal. The NOR circuit 25a outputs a signal at "L" level as the calculation result of the input signals to an inverter 25b. The inverter 25b outputs a signal Read_for_row at "H" level to the row decoder 22 based on the input signal. The row decoder 22 operates when the signal Read_for_row is at "H" level.

When receiving the "READ (type A)" command, the command decoder sets the voltage of the input terminal of an inverter 25c of the control circuit 25 at "L" level. The inverter 25c outputs a signal at "H" level to an inverter 25d based on the received signal. The inverter 25d outputs a signal Read_for_col at "L" level to the column decoder 23 based on the received signal.

When the signal Read_for_col is at "H" level, the column decoder 23 supplies the data stored in the page buffer 21c to the data line DQ. Since the signal Read_for_col is at "L" level at the time of the first read operation (type A), the column decoder 23 does not supply the read data to the data line DQ.

As described above, upon receiving the "READ (type A)" command, the control circuit 25 does not operate the column decoder. Thus, the "READ (type A)" command can be processed as a read command for a row address.

Furthermore, the row decoder 22 locks a row address, when the "READ (type A)" command or the "READ (type B)" command is input after "Active" command is input. When user changes the row address, "PRECHARGE" command is input to the target bank, and "Active" command is input again.

[1-3-1-2] Second Read Operation (Type B)

The second read operation (type B) will be described with reference to FIG. 5.

As shown in FIG. 5, when receiving the "READ (type B)" command from the host 15 (ST4) after the "READ (type A)" command is received, the control circuit 25 enables the page buffer 21c. Based on the selected column address C, the control circuit 25 reads out predetermined column address data stored in the page buffer 21c into the data line DQ (ST5 and ST6). Furthermore in the second read operation (type B), if the control circuit 25 does not receive the "READ (type A)" command before the "READ (type B)" command is received, the control circuit 25 may output the data from the memory cell array 21a to the data line DQ via the page buffer 21c (ST7-ST9). The operation of reading out data from the page buffer 21c to the data line DQ will be referred to as the second read operation (type B) (external read operation) hereinafter.

An operation when the "READ (type B)" command is input to the semiconductor memory device 10 will be briefly described with reference to FIG. 6. As shown in FIG. 6, the "READ (type B)" command is input from the host 15 to the control circuit 25 via the command/address latch circuit 24.

At the time of the second read operation (type B), the command decoder sets the voltage of the first input terminal of the NOR circuit 25a at "L" level, and outputs a signal at "H" level to the second input terminal. Consequently, the NOR circuit 25a outputs a signal at "L" level as the calculation result of the input signals to the inverter 25b, and the inverter 25b outputs the signal Read_for_row at "H" level to the row decoder 22.

Furthermore, the command decoder outputs a signal at "H" level to the inverter 25c of the control circuit 25 based on the "READ (type B)" command. The inverter 25c outputs a signal at "L" level to the inverter 25d based on the received signal. The inverter 25d outputs the signal Read_for_col at "H" level to the column decoder 23 based on the received signal. When the data line strobe DQS (to be described later)

starts, the column decoder 23 supplies the data (DA0 to DA3) stored in the page buffer 21c to the data line DQ.

As described above, upon receiving the "READ (type B)" command, the control circuit 25 operates the column decoder. Therefore, the "READ (type B)" command can be processed as a read command for a column address.

[1-3-1-3] ECC

In this embodiment, ECC may be performed in a read operation.

As shown in FIG. 4, after the "READ (type A)" command is received, the row decoder 22 activates the word line (selection word line) WL corresponding to the row address R in response to an instruction of the control circuit 25.

The sense amplifier determines the data in the memory cell MC by detecting and amplifying a signal output from the memory cell MC to the bit line BL. The sense amplifier outputs the determined data in the memory cell MC to the data latch circuit 27.

The ECC circuit 28 performs ECC processing for the data output to the data latch circuit 27.

When the ECC circuit 28 detects an error in the data, it corrects the error in the data output from the bank BK0 to the data latch circuit 27.

The control circuit 25 checks the result of the ECC processing. The determination result of the presence/absence of an error in the data (the presence/absence of correction of an error) in the ECC processing, the control circuit 25 executes write-back processing. This writes the data corrected by the ECC processing at a predetermined address in the memory cell array 21a.

[1-3-2] Read Operation According to Comparative Example 1

A read operation according to Comparative Example 1 will be described with reference to FIGS. 7 to 9.

In the read operation according to Comparative Example 1, a "READ (1st)" command associated with the bank BK0 is input at time T1. At time T4 when the read latency RL (RL=3) elapses after time T1, the control circuit 25 starts the data line strobe DQS. At time T5, the column decoder 23 outputs the data (DA0 to DA3) stored in the memory cell array 21a of the bank BK0 to the data line DQ.

At time T5 when the period "tRRD" elapses after time T1, a "READ (1st)" command associated with the bank BK1 is input.

Figure 8:
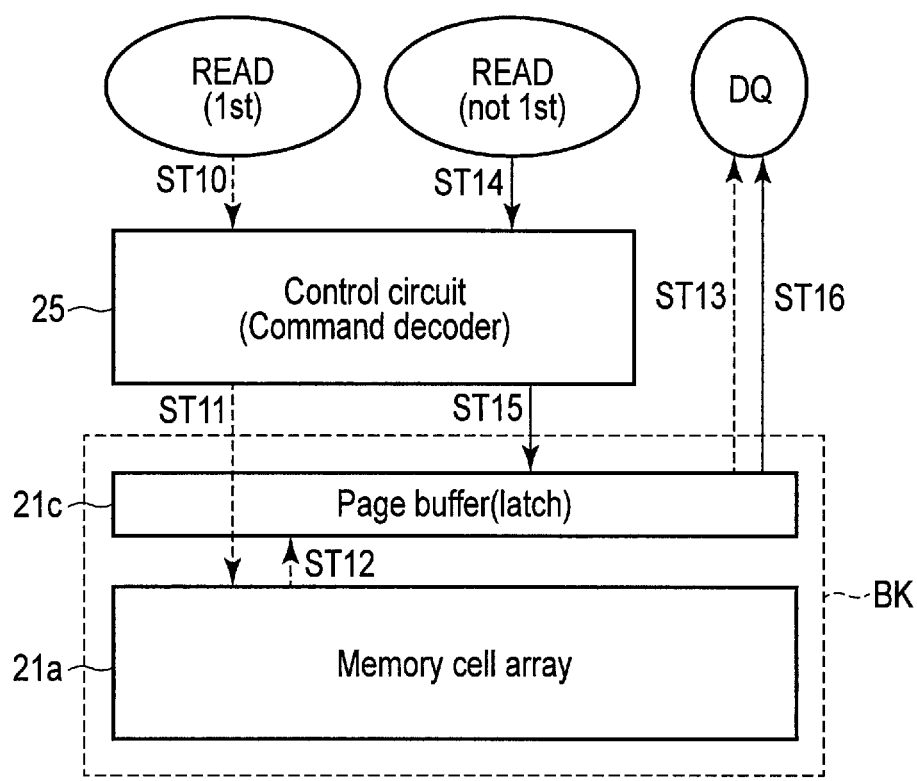
FIG. 8 is a block diagram showing the read operation according to the comparative example.

As shown in FIG. 8, when a semiconductor memory device 10 according to Comparative Example 1 receives the "READ (1st)" command from the host 15 (ST10), the control circuit 25 reads out all data of a page of a selected row from the memory cell array 21a into the page buffer 21c based on the row address R (ST11 and ST12). The readout data are stored in the page buffer 21c. Based on the selected column address C, the control circuit 25 reads out some of the data stored in the page buffer 21c into the data line DQ (ST13). Note that the "READ" command input subsequently to the "ACTIVE" command is described as the "READ (1st)" command. Other "READ" commands are described as "READ (not 1st)" commands.

Upon receiving the "READ (1st)" command, the semiconductor memory device 10 reads out data from the memory cell array 21a. Upon receiving the "READ (not 1st)" command, the semiconductor memory device 10 reads out the data stored in the page buffer 21c.

Furthermore, as shown in FIG. 8, based on the "READ (not 1st)" command and column address C received from the host 15, the control circuit 25 reads out some of the data stored in the page buffer 21c into the data line DQ (ST15 and ST16).

An operation when the "READ" command is input to the semiconductor memory device 10 will be briefly explained with reference to FIG. 9. In Comparative Example 1, the "READ (1st)" command and "READ (not 1st)" command are input at different timings. However, the commands themselves are not different from each other. Therefore, as shown in FIG. 9, regardless of whether the "READ (1st)" command or the "READ (not 1st)" command is input, the row decoder 22 and the column decoder 23 operate in the same manner.

At time T8 when the read latency RL (RL=3) elapses after time T5, the control circuit 25 starts the data line strobe DQS. At time T9, the column decoder 23 outputs the data (DB0 to DB3) stored in the memory cell array 21a to the data line DQ.

Figure 7:
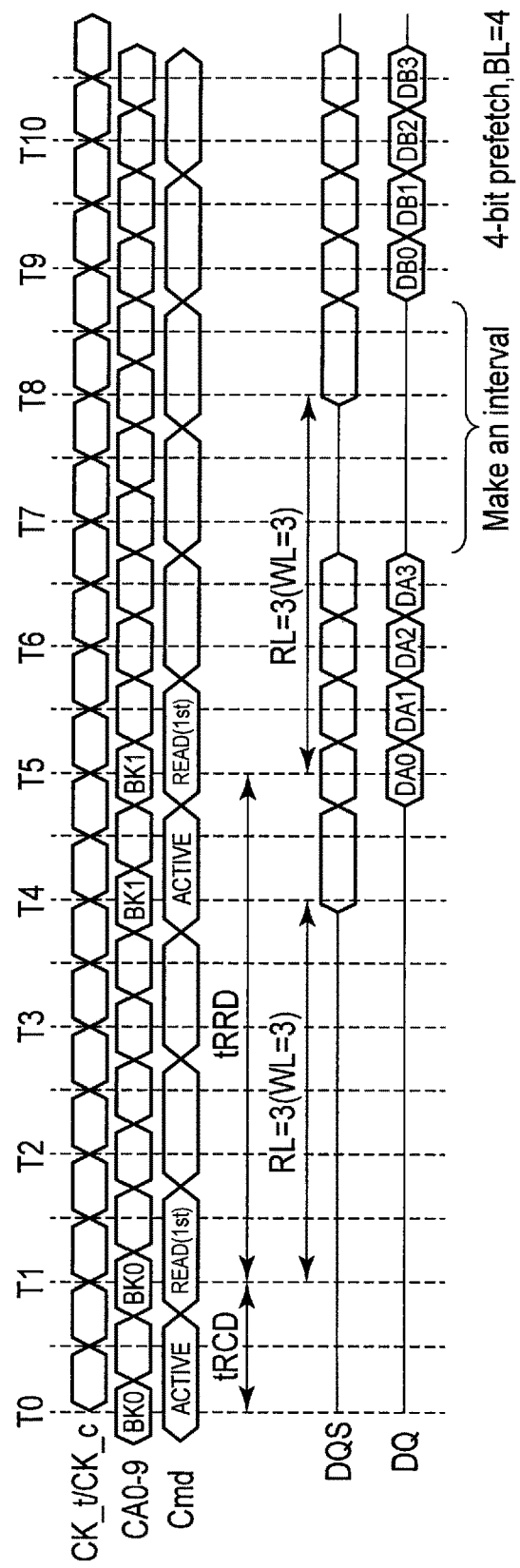
FIG. 7 is a view showing a command sequence of a read operation according to a comparative example.

In the read operation according to Comparative Example 1, as shown in FIG. 7, an interval occurs in the data line DQ, unlike the read operation of the embodiment. Therefore, it is difficult to efficiently use the data line DQ.

[1-3-3] Read Operation According to Comparative Example 2

Figure 10:
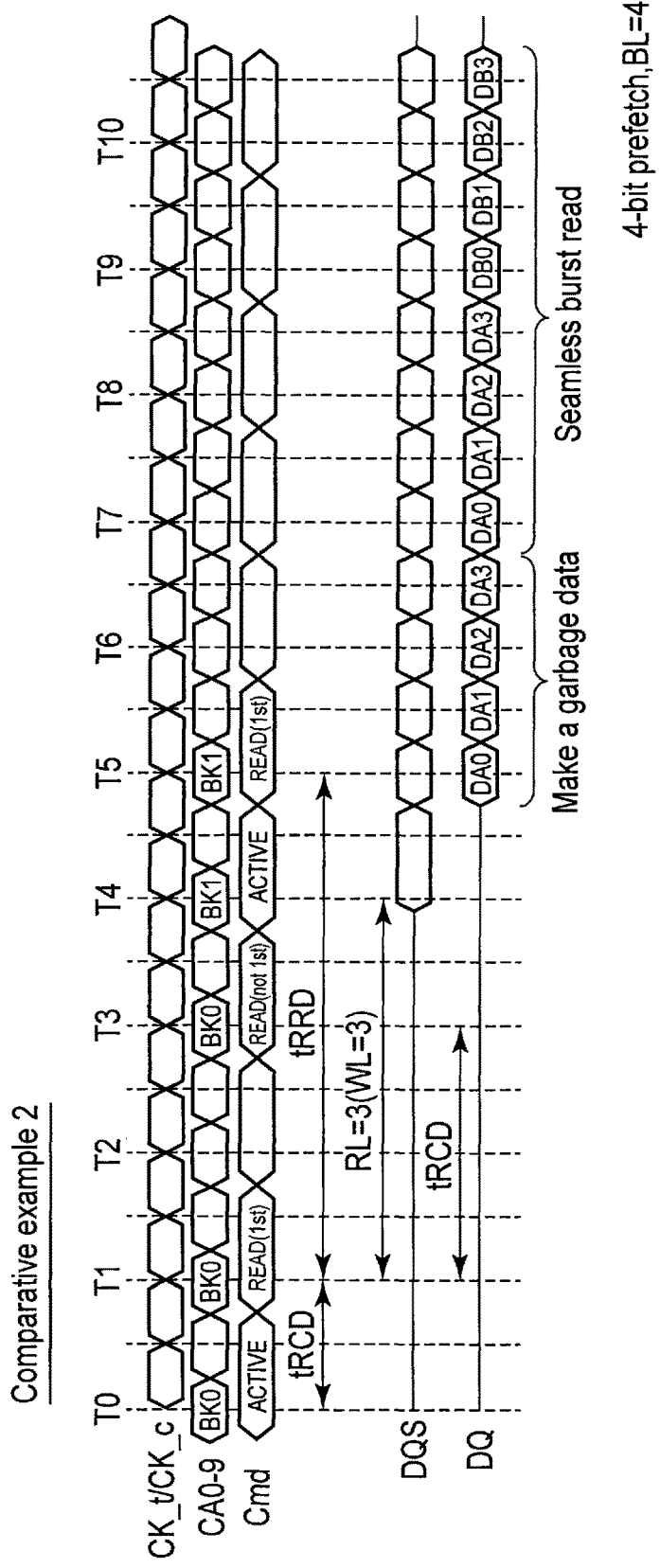
FIG. 10 is a view showing the command sequence of a read operation according to another comparative example.

A read operation according to Comparative Example 2 will be described with reference to FIG. 10.

The read operation according to Comparative Example 2 intends to omit an interval when the data (DA0 to DA3) stored in the bank BK0 and the data (DB0 to DB3) stored in the bank BK1 are output to the data line DQ.

A control circuit 25 according to Comparative Example 2 performs, for the bank BK0, a read operation (1st) using the "READ (1st)" command and a read operation (not 1st) using the "READ (not 1st)" command. According to Comparative Example 2, however, the read operation of the same data is performed twice to omit the interval of the data line DQ. Unlike the read operation according to the embodiment, therefore, in the read operation according to Comparative Example 2, unnecessary data are output to the data line DQ.

[1-4] Command Truth Table

A command truth table associated with each command described above will be explained.

[1-4-1] Command Truth Tables According to First Specification

Command truth tables according to the first specification (for example, an LPDDR (Low-Power Double Data Rate) system) will be described with reference to FIGS. 11 and 12.

The "ACTIVE" command according to this embodiment will be described with reference to FIG. 11. Referring to FIG. 11, arrows of the clock CLK indicate the rising edge and falling edge of the clock, respectively. In FIG. 11, CA0 to CA9 represent commands and addresses input from command/address pads (command/address lines). The bank address BA for designating a bank includes, for example, 3 bits (BA0 to BA2). The row address R includes, for example, 18 bits (R0 to R17). Out of the full row address bits R0 to R17, the first row address (part of the full row address) input together with the "ACTIVE" command includes, for example, the lower bits R0 to R13. Out of the full row address bits R0 to R17, the second row address (the remaining part of the full row address) input together with the "READ" command (or the "WRITE" command) includes, for example, the upper bits R14 to R17. The column address C includes, for example, 5 bits (C1 to C5).

Referring to FIG. 11, an active operation is designated by the rising edge and falling edge of the clock CLK when the "ACTIVE" command is input. The "ACTIVE" command asserts a chip select signal CS and is defined using CA0=L and CA1=H at the rising edge of the clock CLK. At the rising edge of the clock CLK, the row address bits R8 to R12 are input from pads CA2 to CA6, and the bank address bits BA0 to BA2 are input from pads CA7 to CA9. At the falling edge of the clock CLK, the row address bits R0 to R7 and R13 are input from the pads CA0 to CA8. "X" indicates "don't care".

The "READ" command (or "WRITE" command) according to this embodiment will be described with reference to FIG. 12.

Referring to FIG. 12, a read or write operation is designated at the rising edge of the clock CLK when the "READ" command (or "WRITE" command) is input, and a post-active operation is designated at the falling edge of the clock CLK. That is, the "READ" command (or "WRITE" command) can set the read or write operation and the post-active operation. The "READ" command asserts the chip select signal CS and is defined using CA0=H, CA1=L, and CA2=L at the rising edge of the clock CLK. The "WRITE" command asserts the chip select signal CS and is defined using CA0=H, CA1=L, and CA2=H at the rising edge of the clock CLK.

In the read or write operation, the column address bits C1 and C2 are input from the pads CA5 and CA6, and the bank address bits BA0 to BA2 are input from the pads CA7 to CA9.

In the post-active operation, the column address bits C3 to C5 are input from the pads CA1 to CA7, and the upper row address bits R14 to R17 are input from the pads CA6 to CA9.

In FIG. 12, "RFU" indicates "reserved for future use", and "AP" is a flag which defines auto-precharge.

As shown in FIG. 12, in this embodiment, a signal at "H" or "L" level is input to the pad CA3 at the rising edge of the clock CLK.

As shown in FIG. 12, if a signal at "H" level is input to the pad CA3 at the rising edge, the control circuit 25 determines that the "READ (type A)" command has been input. Alternatively, if a signal at "L" level is input to the pad CA3 at the rising edge, the control circuit 25 determines that the "READ (type B)" command has been input.

To the contrary, in each of the comparative examples, as shown in FIG. 13, "RFU" is set for the pad CA3 at the rising edge of the clock CLK.

[1-4-2] Command Truth Table According to Second Specification

An example of a command truth table according to the second specification (for example, a DDR (Double Data Rate) system) will be described with reference to FIG. 14.

According to the second specification, an address is input from the pads A0 to A17 (the pads A0 to A13 and A17 are not shown). As shown in FIG. 14, the pad A14 is shared with the pad of a write enable signal WE_n, the pad A15 is shared with the pad of a column address strobe signal CAS_n, and the pad A16 is shared with the pad of a row address strobe signal RAS_n.

As shown in FIG. 14, with respect to the "READ (type A)" command, a chip select signal CS_n is at "L" level, an active signal ACT_n is at "H" level, the row address strobe signal RAS_n is at "L" level, the column address strobe signal CAS_n is at "H" level, and the write enable signal WE_n is at "H" level. With respect to the "READ (type B)" command, the chip select signal CS_n is at "L" level, the active signal ACT_n is at "H" level, the row address strobe signal RAS_n is at "H" level, the column address strobe signal CAS_n is at "L" level, and the write enable signal WE_n is at "H" level.

As shown in FIG. 15, in each of the comparative examples, a command assigned to the "READ (type A)" command in the embodiment is set as an unused command "RFU".

[1-5] Effects of First Embodiment

[1-5-1] Effect 1

According to the above-described embodiment, at the time of a read operation, an internal read operation of reading out data from the memory cell array to the page buffer and an external read operation of reading out data from the page buffer to the data line DQ are performed.

According to Comparative Example 1 described above, an interval occurs when outputting data to the data line DQ at the time of a read operation.

According to Comparative Example 2 described above, if data are seamlessly output to the data line DQ at the time of a read operation, unnecessary data are unwantedly output to the data line DQ.

Figure 16:
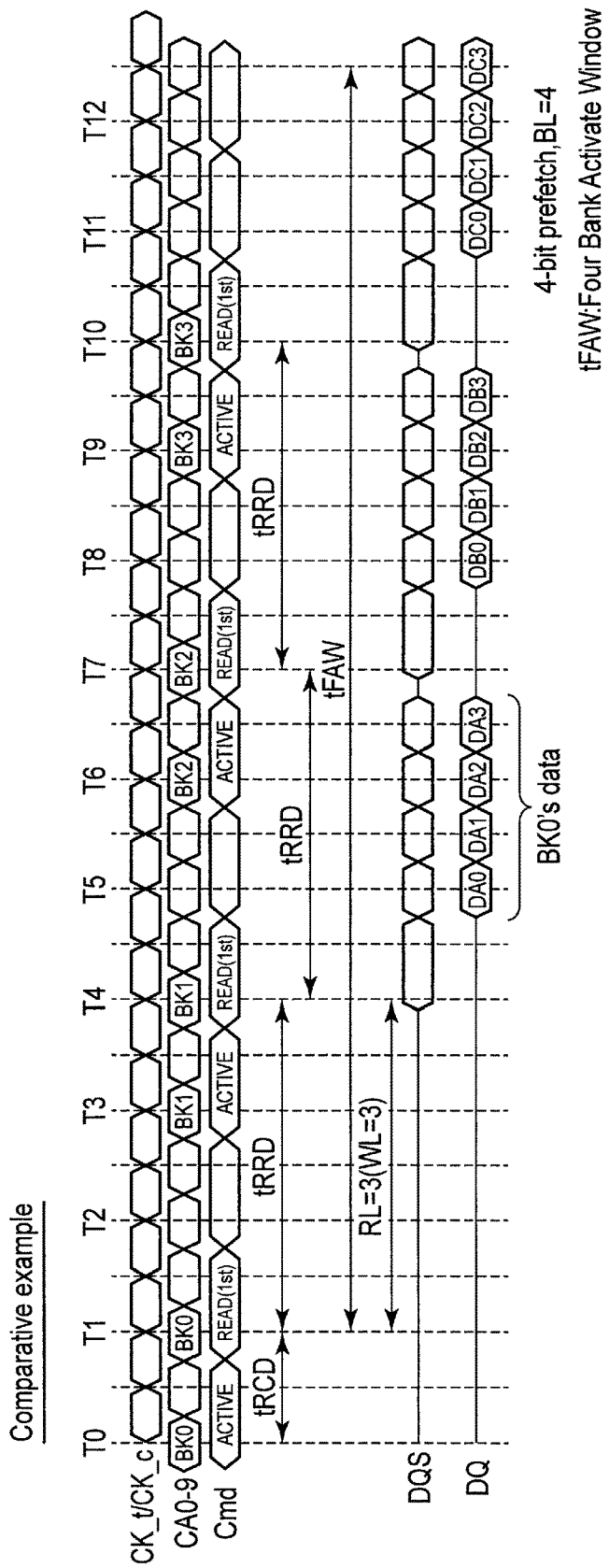
FIG. 16 is a view showing the command sequence of the read operation according to each of the comparative examples.

According to each of the comparative examples, as shown in FIG. 16, if an internal read operation is performed at the time of a read operation but it is not necessary to perform an external read operation, data are output to the data line DQ. This imposes a problem that the data line DQ is unnecessarily occupied.

As described above, however, the semiconductor memory device 10 according to this embodiment can separately perform the internal read operation and external read operation, as needed.

For example, as shown in FIG. 17, if the internal read operation is performed at the time of a read operation but it is not necessary to perform the external read operation, it is possible to read out data into the page buffer 21c of each bank without outputting the data to the data line DQ. As a result, it is possible to seamlessly output the data to the data line DQ. This allows the host 15 to effectively use the data line DQ. Consequently, it is possible to improve the operation performance of the memory system 1.

[1-5-2] Effect 2

Figure 18:
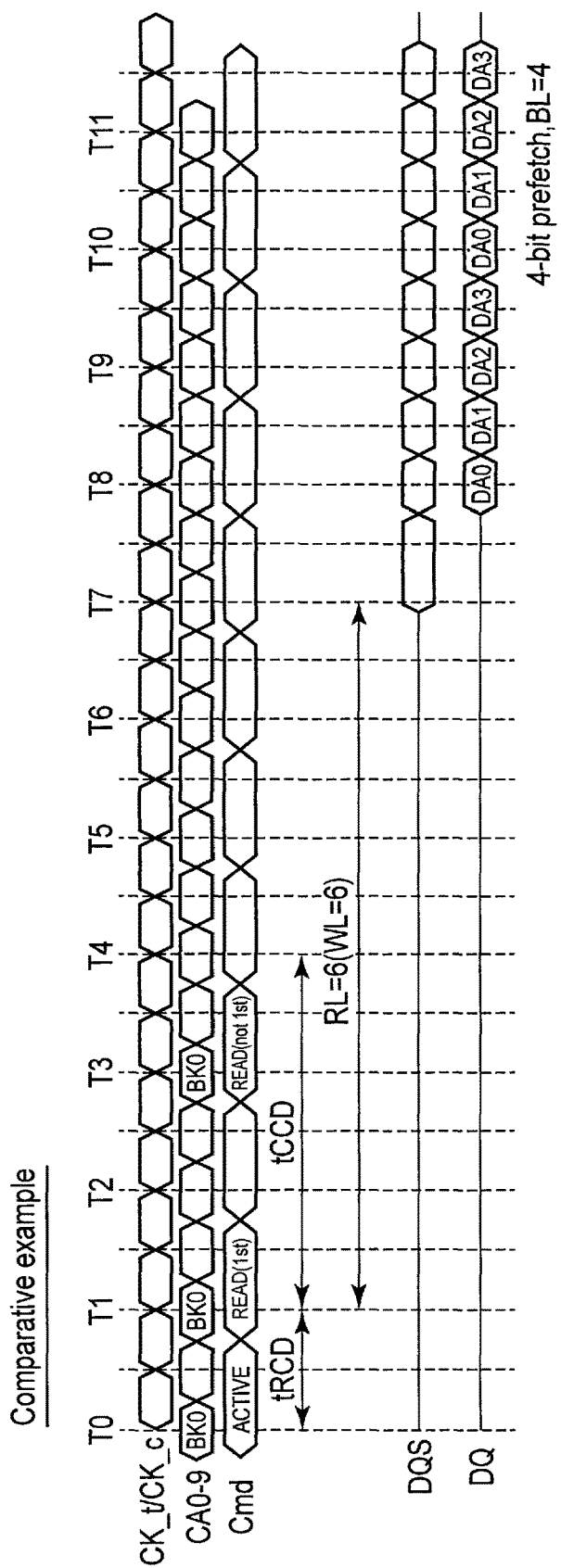
FIG. 18 is a view showing the command sequence of the read operation according to each of the comparative examples.

As shown in FIG. 18, in each of the comparative examples, when the "READ (1st)" command is issued, the data are output to the data line DQ. Therefore, in each of the comparative examples, the operation specification of the semiconductor memory device 10 is defined by the read latency RL. The read latency RL indicated a time for waiting till the end of the read operation.

On the other hand, as shown in FIG. 19, according to the first embodiment, when the "READ (type A)" command is issued, the row address R is set. Then, when the "READ (type B)" command is issued, and the column address C is set, data are output to the data line DQ. In the first embodiment, the "READ (type A)" command can be interpreted as a row command, and the "READ (type B)" command can be interpreted as a column command. In the first embodiment, a period from the "READ (type A)" command to the "READ (type B)" command can be defined as tRCD. Consequently, the read latency RL necessary to output the data to the data line DQ is a latency necessary to set the column address C, and is equal to the period tCCD.

As described above, the read latency RL according to the first embodiment is shorter than that according to each of the comparative examples. The operation specification of the semiconductor memory device 10 can be defined by the period tRCD. This can operate the device according to the same specification as that of the DRAM even if the MRAM is used as the memory cell array 21a.

Furthermore, since the read latency RL according to the first embodiment is shorter than that according to each of the comparative examples, it is possible to suppress a circuit necessary to generate the read latency RL.

Also, the semiconductor memory device 10 according to the first embodiment can read out data from a memory cell to undergo a write operation at the time of the write operation, thereby performing the write operation for the memory cell.

In the first embodiment, if the "READ (type A)" command is issued, the row address R is set. After that, if the "WRITE" command is issued, the column address C is set and data are input to the data line DQ. In the first embodiment, the "READ (type A)" command can be interpreted as a row command, and the "WRITE" command can be interpreted as a column command. In the first embodiment, therefore, a period from the "READ (type A)" command to the "WRITE" command can be defined as tRCD. Consequently, a write latency WL (see FIG. 4) necessary to input data to the data line DQ is a latency necessary to set the column address C, and is equal to the period tCCD.

[2] Second Embodiment

The second embodiment will be described next. In the second embodiment, a latency switching method will be explained. Note that the basic arrangement and operation of a memory device according to the second embodiment are the same as those of the memory device according to the above-described first embodiment. Therefore, a description about the points which have been explained in the aforementioned first embodiment and points which can be easily analogized from the aforementioned first embodiment will be omitted.

The command decoder of a control circuit 25 includes a latency selection circuit for switching a latency in response to a command first input to a semiconductor memory device 10.

[2-1] Arrangement of Latency Selection Circuit

The latency selection circuit according to this embodiment will be described with reference to FIG. 20.

Figure 20:
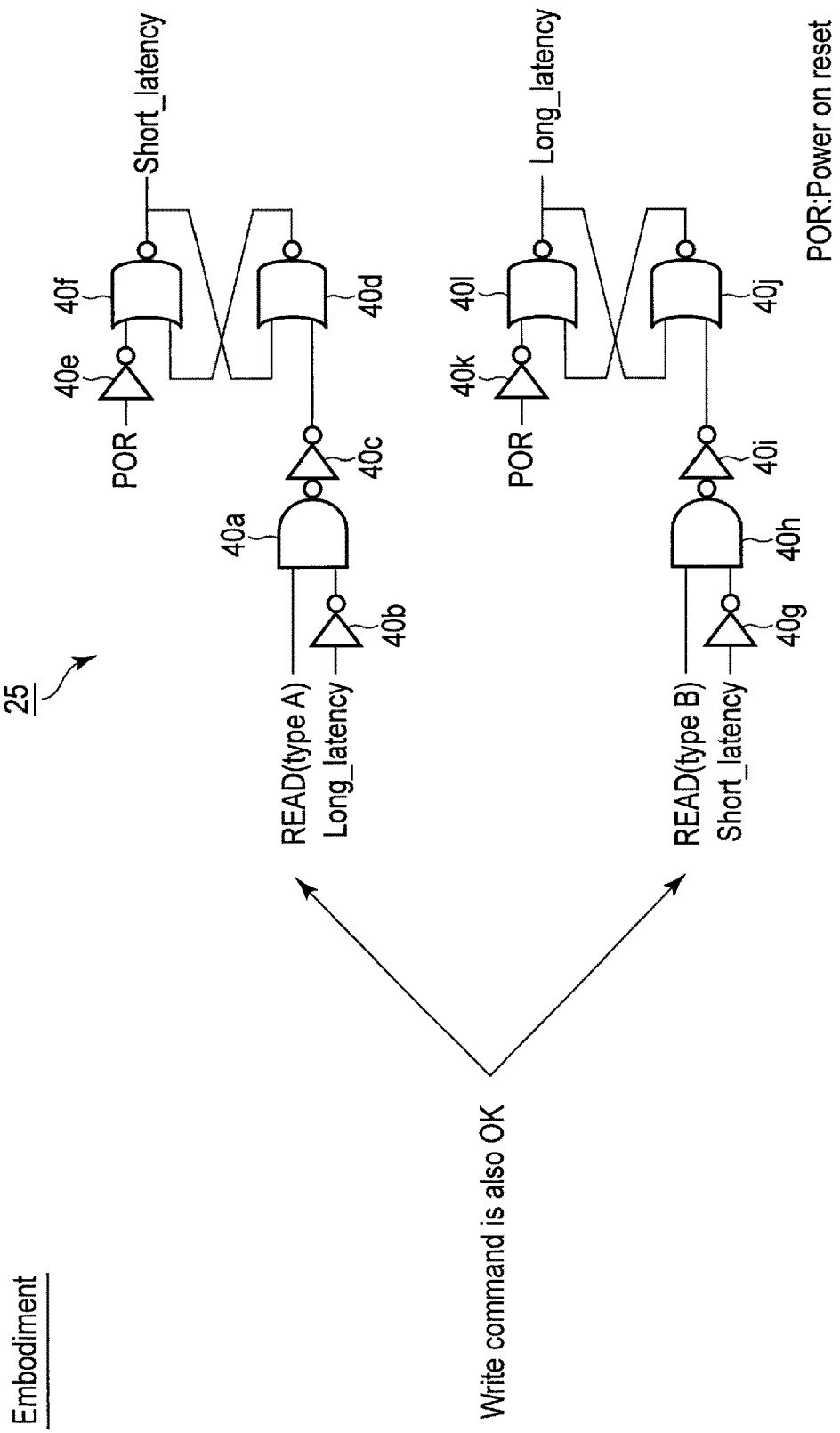
FIG. 20 is a circuit diagram showing an example of the latency selection circuit of a memory system according to the second embodiment.

As shown in FIG. 20, the latency selection circuit includes NAND circuits 40a and 40h, inverters 40b, 40c, 40e, 40g, 40i, and 40k, and NOR circuits 40d, 40f, 40j, and 40l.

The inverter 40b receives a signal "Long_latency", and inverts and outputs the signal "Long_latency". The NAND circuit 40a receives a "READ (type A)" command at the first input terminal, and the output signal of the inverter 40b at the second input terminal. The NAND circuit 40a outputs a calculation result. The inverter 40c receives the output signal of the NAND circuit 40a, and inverts and outputs the input signal.

The NOR circuit 40d receives the output signal of the inverter 40c at the first input terminal, and the output signal of the NOR circuit 40f at the second input terminal. The NOR circuit 40d then outputs a calculation result. The inverter 40e receives a signal "POR (Power On Reset)", and inverts and outputs the signal "POR". The NOR circuit 40f receives the output signal of the inverter 40e at the first input terminal, and the output signal of the NOR circuit 40d at the second input terminal. Then, the NOR circuit 40f outputs a signal "Short_latency" as a calculation result.

The inverter 40g receives a signal "Short_latency", and inverts and outputs the signal "Short_latency". The NAND circuit 40h receives a signal "READ (type B)" command at the first input terminal, and the output signal of the inverter 40g at the second input terminal. The NAND circuit 40h outputs a calculation result. The inverter 40i receives the output signal of the NAND circuit 40h, and inverts and outputs the input signal.

The NOR circuit 40j receives the output signal of the inverter 40i at the first input terminal, and the output signal of the NOR circuit 40l at the second input terminal. The NOR circuit 40j outputs a calculation result. The inverter 40k receives the signal "POR", and inverts and outputs the signal "POR". The NOR circuit 40l receives the output signal of the inverter 40k at the first input terminal, and the output signal of the NOR circuit 40j at the second input terminal. The NOR circuit 40l outputs the signal "Long_latency" as a calculation result.

Note that in the latency selection circuit, the signals "Short_latency" and "Long_latency" are fixed at "L (low)" level in the initial state. If the first input command is the "READ (type A)" command, the signal "Short_latency" is set at "H" level and the signal "Long_latency" is set at "L (low)" level. Based on the signal "Short_latency", for example, the read latency RL according to each of the comparative examples is generated.

Alternatively, if the first input command is the "READ (type B)" command, the signal "Short_latency" is set at "L" level and the signal "Long_latency" is set at "H" level. Based on the signal "Long_latency", for example, the read latency RL according to the first embodiment is generated. Unless the signal "POR" is reset, the signals "Short_latency" and "Long_latency" are fixed.

Note that in the example shown in FIG. 20, the "READ (type A)" command is input to the first input terminal of the NAND circuit 40a and the "READ (type B)" command is input to the first input terminal of the NAND circuit 40h. The present invention is not necessarily limited to this. A "WRITE" command may be input instead of the "READ (type A)" command or "READ (type B)" command.

[2-2] Arrangement of Idle Circuit

An idle circuit for resetting the signal "POR" will be described with reference to FIG. 21. The idle circuit is provided in, for example, the command decoder of the control circuit 25.

Figure 21:
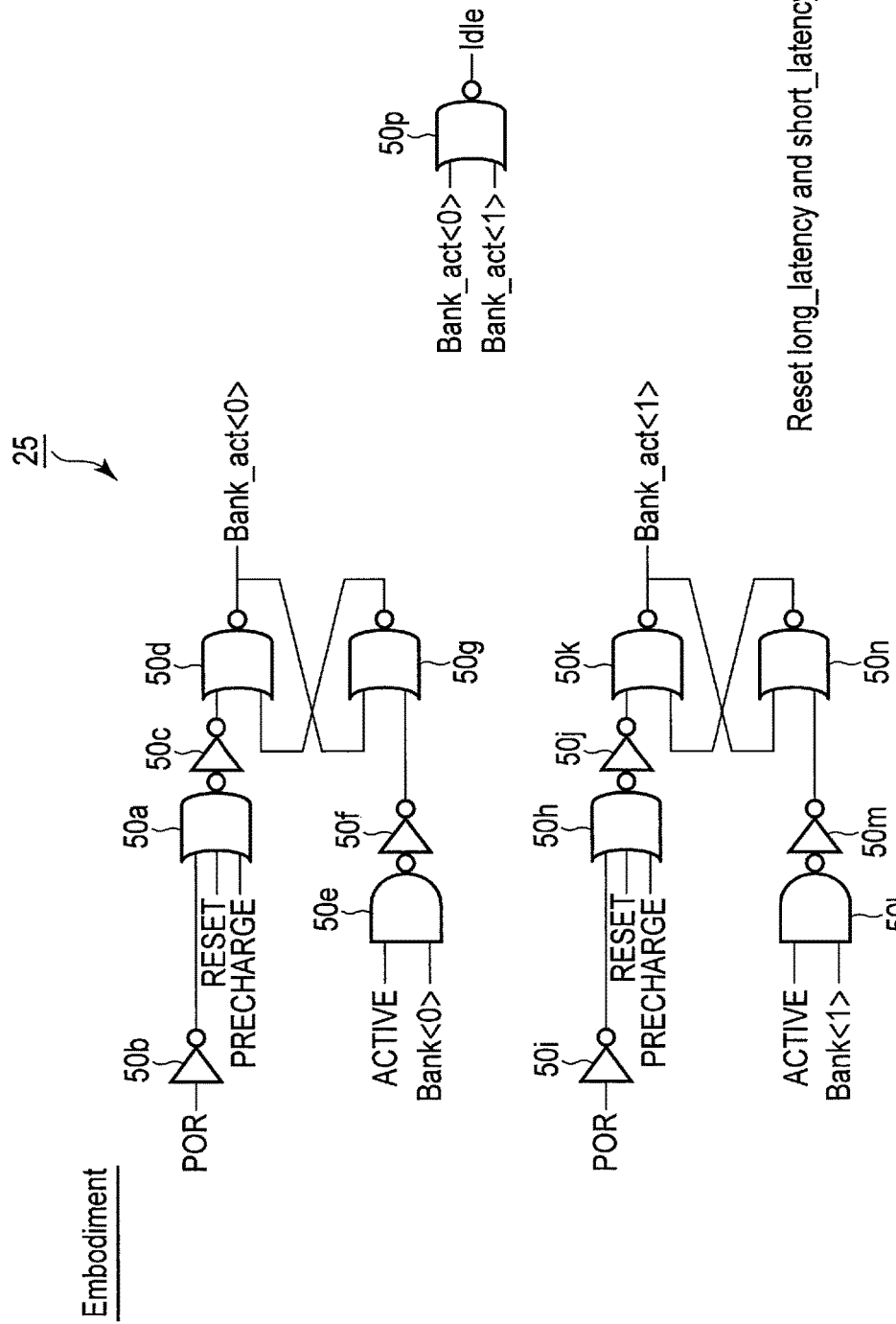
FIG. 21 is a circuit diagram showing an example of the idle circuit of the memory system according to the second embodiment.

As shown in FIG. 21, the idle circuit includes NOR circuits 50a, 50d, 50g, 50h, 50k, 50n, and 50p, inverters 50b, 50c, 50f, 50i, 50j, and 50m, and NAND circuits 50e and 50l.

The inverter 50b receives the signal "POR" at the input terminal, and inverts and outputs the signal "POR". The NOR circuit 50a receives the output signal of the inverter 50b at the first input terminal, a signal "RESET" at the second input terminal, and a "PRECHARGE" command at the third input terminal, and outputs a calculation result. The inverter 50c inverts and outputs the output signal of the NOR circuit 50a.

The NAND circuit 50e receives an "ACTIVE" command at the first input terminal, and a signal "BANK<0>" at the second input terminal, and outputs a calculation result. The inverter 50f inverts and outputs the output signal of the NAND circuit 50e.

The NOR circuit 50d receives the output signal of the inverter 50c at the first input terminal, and the output signal of the NOR circuit 50g at the second input terminal, and outputs a signal "Bank_act<0>" as a calculation result.

The NOR circuit 50g receives the output signal of the inverter 50f at the first input terminal, and the output signal of the NOR circuit 50d at the second input terminal, and outputs a calculation result.

The inverter 50i receives the signal "POR" at the input terminal, and inverts and outputs the signal "POR". The NOR circuit 50h receives the output signal of the inverter 50i at the first input terminal, the signal "RESET" at the second input terminal, and the "PRECHARGE" command at the third input terminal, and outputs a calculation result. The inverter 50j inverts and outputs the output signal of the NOR circuit 50h.

The NAND circuit 50l receives the "ACTIVE" command at the first input terminal, and a signal "BANK<1>" at the second input terminal, and outputs a calculation result. The inverter 50m inverts and outputs the output signal of the NAND circuit 50l.

The NOR circuit 50k receives the output signal of the inverter 50j at the first input terminal, and the output signal of the NOR circuit 50n at the second input terminal, and outputs a signal "Bank_act<1>" as a calculation result.

The NOR circuit 50n receives the output signal of the inverter 50m at the first input terminal, and the output signal of the NOR circuit 50k at the second input terminal, and outputs a calculation result.

The NOR circuit 50p receives the signal "Bank_act<0>" at the first input terminal, and the signal "Bank_act<1>" at the second input terminal, and outputs a signal "Idle" as a calculation result.

If, for example, all the banks are reset, the signal "Idle" is set at "H" level. After the signal "Idle" is set at "H" level, the control circuit 25 resets all the signals in the semiconductor memory device 10.

This also resets the signal "POR". As a result, it is possible to select a latency in the latency selection circuit described with reference to FIG. 20.

As described above, it is possible to dynamically select a latency by using the idle circuit.

Note that the signal "RESET" indicates a "RESET" command or hardware reset of the semiconductor memory device 10 (for example, reset is performed by a reset pin provided in the semiconductor memory device 10).

[2-3] Effect of Second Embodiment

According to the above-described embodiment, the semiconductor memory device according to this embodiment includes the latency selection circuit capable of selecting a latency, as needed, based on the input read or write command. It is thus possible to change a latency, as needed, according to the use purpose of the user of the semiconductor memory device.

[3] Third Embodiment

Figure 22:
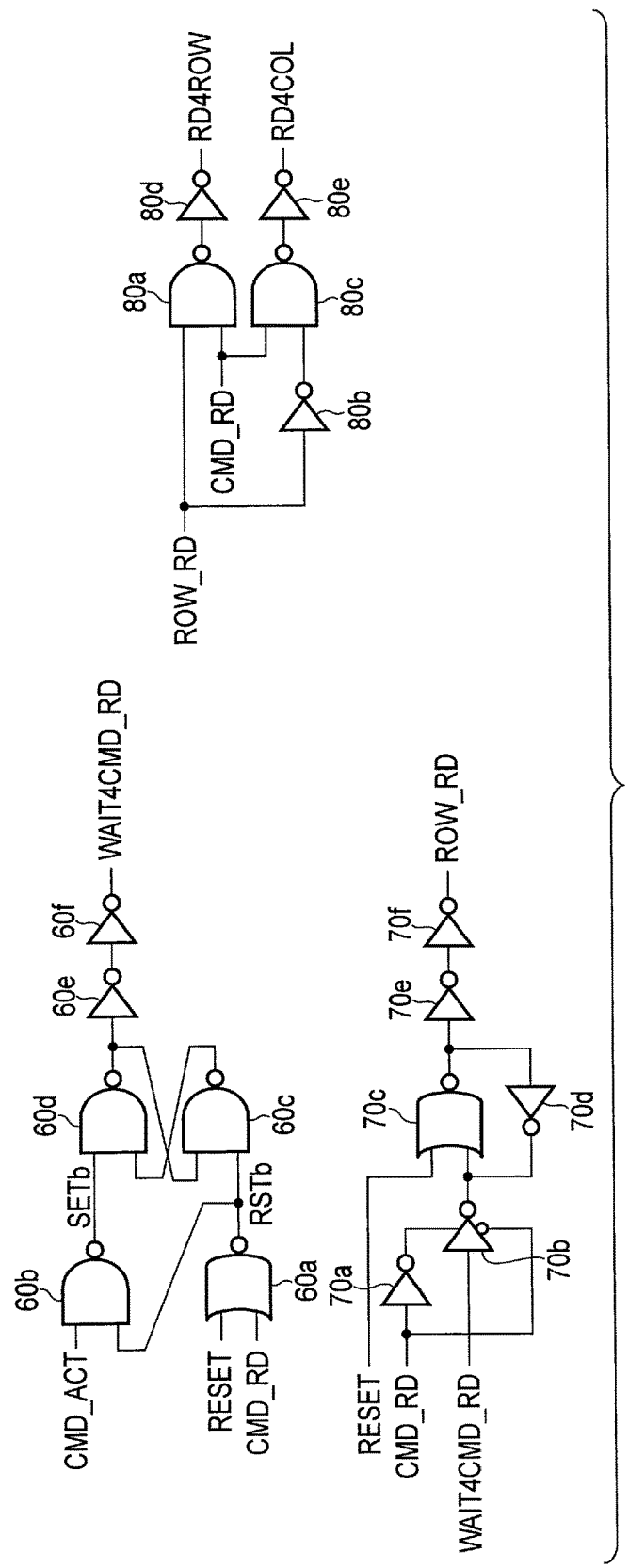
FIG. 22 is a circuit diagram showing an example of the command determination circuit of a memory system according to the third embodiment.

The third embodiment will be described with reference to FIGS. 22 and 23. In the third embodiment, a method of determining whether the command is the above-described "READ (type A)" command or "READ (type B)" command will be explained. Note that the basic arrangement and operation of a memory device according to the third embodiment are the same as those of the memory device according to the above-described first embodiment. Therefore, a description about the points which have been explained in the aforementioned first embodiment and points which can be easily analogized from the aforementioned first embodiment will be omitted.

A control circuit 25 includes a command determination circuit for determining whether the command is the "READ (type A)" command or "READ (type B)" command based on commands input to a semiconductor memory device 10.

In this embodiment, if an "ACTIVE" command and "READ" command are continuously input from a host 15, the control circuit 25 determines the input "READ" command as a row "READ (type A)" command. Note that the above-described "ACTIVE" command and "READ" command are commands issued for the same bank in this embodiment.

Alternatively, if the "READ" command and "ACTIVE" command are discontinuously input from the host 15, the control circuit 25 determines the input "READ" command as a column "READ (type B)" command. The circuit arrangement and operation of the command determination circuit will be described below.

[3-1] Arrangement of Command Determination Circuit

The command determination circuit according to this embodiment will be explained with reference to FIG. 22. As shown in FIG. 22, the command determination circuit includes NOR circuits 60a and 70c, NAND circuits 60b, 60c, 60d, 80a, and 80c, and inverters 60e, 60f, 70a, 70b, 70d, 70e, 70f, 80b, 80d, and 80e.

The NOR circuit 60a receives, from the host 15, a "RESET" signal at the first input terminal and a "CMD_RD" signal at the second input terminal. If the "READ" command is input, the "CMD_RD" signal is set at "H" level; otherwise, the "CMD_RD" signal is set at "L" level. The NOR circuit 60a outputs the calculation result (RSTb) of the input signals from the output terminal.

The NAND circuit 60b receives a "CMD_ACT" signal at the first input terminal, and the output signal RSTb of the NOR circuit 60a at the second input terminal. If the "ACTIVE" command is input, the "CMD_ACT" signal is set at "H" level; otherwise, the "CMD_ACT" signal is set at "L" level. The NAND circuit 60b outputs the calculation result (SETb) of the input signals from the output terminal.

The NAND circuit 60c receives the output signal (RSTb) of the NOR circuit 60a at the first input terminal, and the output signal of the NAND circuit 60d at the second input terminal. The NAND circuit 60c outputs the calculation result of the input signals from the output terminal. The NAND circuit 60d receives the output signal (SETb) of the NAND circuit 60b at the first input terminal, and the output signal of the NAND circuit 60c at the second input terminal. The NAND circuit 60d outputs the calculation result of the input signals from the output terminal.

The inverter 60e inverts the output signal of the NAND circuit 60d, and the inverter 60f inverts the output signal of the inverter 60e, thereby generating a "WAIT4CMD_RD" signal. Note that the "WAIT4CMD_RD" signal is a signal indicating a "READ" command standby state after the "ACTIVE" command is input.

The inverter 70*a* inverts the "CMD_RD" signal. The inverter 70*b* inverts and outputs the "WAIT4CMD_RD" signal by the "CMD_RD" signal.

The NOR circuit 70*c* receives the "RESET" signal at the first input terminal, and the output signal of the inverter 70*b* at the second input terminal. The NOR circuit 70*c* then outputs a calculation result based on the input signals. The inverter 70*d* inverts the output signal of the NOR circuit 70*c*, and outputs the inverted signal to the second input terminal of the NOR circuit 70*c*.

The inverter 70*e* inverts the output signal of the NOR circuit 70*c*, and the inverter 70*f* inverts the output signal of the inverter 70*e*, thereby generating a "ROW_RD" signal. Note that the "ROW_RD" signal is a signal used to determine whether the "READ" command input to the semiconductor memory device 10 is a row or column command.

The NAND circuit 80*a* receives the "ROW_RD" signal at the first input terminal, and the "CMD_RD" signal at the second input terminal. The NAND circuit 80*a* outputs a calculation result based on the input signals. The inverter 80*d* inverts the output signal of the NAND circuit 80*a* to generate an "RD4ROW" signal. If the "RD4ROW" signal is at "H" level, the control circuit 25 determines the "READ" command as a "READ (type A)" command.

The inverter 80*b* inverts the signal ROW_RD. The NAND circuit 80*c* receives the output result of the inverter 80*b* at the first input terminal, and the "CMD_RD" signal at the second input terminal. The NAND circuit 80*c* outputs a calculation result based on the input signals. The inverter 80*e* inverts the output signal of the NAND circuit 80*c* to generate an "RD4COL" signal. If the "RD4COL" signal is at "H" level, the control circuit 25 determines the "READ" command as a "READ (type B)" command.

[3-2] Operation of Command Selection Circuit

The operation of the command selection circuit according to this embodiment will be described with reference to FIGS. 22 and 23.

An operation when the "ACTIVE" command and "READ" command are continuously input will be explained.

As shown in FIG. 23, at time T0, the "CMD_ACT" signal, "CMD_RD" signal, and "RESET" signal are at "L" level. In this case, the "RD4ROW" signal and "RD4COL" signal are set at "L" level. At time T1, when the "ACTIVE" command is input, the "CMD_ACT" signal is set at "H" level. Therefore, at time T2, the inverter 60*f* shown in FIG. 22 changes the level of the "WAIT4CMD_RD" signal from "L" level to "H" level. At time T3, the inverter 70*f* changes the level of the "ROW_RD" signal from "L" level to "H" level.

At time T4, the "READ" command is input subsequently to the "ACTIVE" command. This sets the "CMD_ACT" signal at "L" level, and the "CMD_RD" signal at "H" level. After the "CMD_ACT" signal is set at "L" level and the "CMD_RD" signal is set at "H" level, the inverter 60*f* changes the level of the "WAIT4CMD_RD" signal to "L" level at time T5. At time T4, however, the second input terminal of the NOR circuit 70*c* is at "L" level, and the "CMD_RD" signal is set at "H" level. This disables the operation of the inverter 70*b*. Consequently, even if the level of the "WAIT4CMD_RD" signal is set at "L" level at time T5 when a predetermined time elapses after time T4, the inverter 70*b* outputs no inverted signal. The inverter 70*f*, therefore, maintains the level of the "ROW_RD" signal at "H" level. Since the "CMD_RD" signal is set at "H" level at time T4, the inverter 80*d* sets the "RD4ROW" signal at "H" level. Then, at time T6, the input of the "READ" command is complete. Thus, the "CMD_RD" signal is set at "L" level, and the inverter 80*d* sets the "RD4ROW" signal at "L" level. At time T7, the inverter 70*f* sets the "ROW_RD" signal at "L" level.

As described above, when the "ACTIVE" command and "READ" command are continuously input, the control circuit 25 determines the input "READ" command as a row "READ (type A)" command.

A case in which the "READ" command and "ACTIVE" command are discontinuously input will be described.

As shown in FIG. 23, when the "READ" command is input at time T10, the CMD_RD" signal is set at "H" level. This causes the inverter 80*e* shown in FIG. 22 to set the "RD4COL" signal at "H" level. Then, the control circuit 25 determines that the "READ" command input at time T10 is a column "READ (type B)" command.

[3-3] Effect 1

According to the above-described embodiment, it is possible to classify the identical "READ" commands into the row "READ (type A)" command and the column "READ (type B)" command. The effect described with reference to FIG. 19 can be obtained.

[4] Others

In each of the above-described embodiments, the row address R includes, for example, 18 bits (R0 to R17), the column address C includes, for example, 5 bits (C1 to C5), and the bank address BA includes, for example, 3 bits (BA0 to BA2). However, the present invention is not limited to this.

In each of the above-described embodiments, a read or write operation is performed for each bank. The present invention, however, is not limited to this. For example, the semiconductor memory device according to each of the above-described embodiments may perform a read or write operation for a plurality of banks.

The arrangement of the bank described in each of the above-described embodiments is merely an example, and can be variously changed.

In each of the above-described embodiments, the first specification and the second specification are applicable. However, the present invention is not limited to this, and can be applied to other specifications.

The standard applied to the semiconductor memory of each of the embodiments is not limited to the JEDEC memory standards such as the LPDDR standard and DDR standard. The semiconductor memory of each of the embodiments may be a memory which is not based on a specific standard.

In each of the embodiments, the ECC circuit (ECC function) may be provided in the host 15 instead of the semiconductor memory device 10.

In each of the above embodiments, the MRAM which uses a magnetoresistive effect element has been exemplified as a semiconductor memory device. However, the present invention is not limited to this, and is applicable to various kinds of semiconductor memory devices regardless of whether the memory devices are volatile or nonvolatile. The present invention is also applicable to resistance change memories of the same type as the MRAM, such as an ReRAM (Resistive Random Access Memory) and PCRAM (Phase-Change Random Access Memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a memory area;
   a control circuit configured to:
      in response to receiving a first command, read out data from the memory area without outputting the data to a data line, and
      in response to receiving a second command after receiving a first active command, output the data read out from the memory area to the data line;
   a latency selection circuit configured to select a first latency if the first command is received after a first signal is reset, select a second latency if the second command is received after the first signal is reset, and prevent the selection from being changed until the first signal is reset if one of the first latency and the second latency is selected; and
   a storage unit configured to store the data read out from the memory area,
   wherein:
   if the second command is input, the control circuit outputs the data from the memory area or the storage unit to the data line after the selected first latency, and
   if a write command is input, the control circuit writes data in the memory area after the selected second latency.

2. The memory device according to claim 1, further comprising:
   a row decoder configured to select a row in the memory area; and
   a column decoder configured to select a column in the memory area,
   wherein:
   in response to the first command, the control circuit selects the row using the row decoder, and selects no column using the column decoder, and
   in response to the second command, the control circuit selects the row using the row decoder, and selects the column using the column decoder.

3. The memory device according to claim 1, wherein:
   the memory area includes a page including plural pieces of data,
   in response to the first command, the control circuit stores the plural pieces of data of the page read out from the memory area in the storage unit without outputting the plural pieces of data to the data line, and
   in response to the second command, the control circuit outputs some of the plural pieces of data of the page stored in the storage unit to the data line.

4. The memory device according to claim 1, wherein:
   the memory area is divided into a plurality of memory banks,
   in response to the first command which is associated with a predetermined memory bank, the control circuit stores data read out from the predetermined memory bank in the storage unit without outputting the data to the data line, and
   in response to the second command which is associated with the predetermined memory bank, the control circuit outputs the data stored in the predetermined memory bank or the storage unit to the data line.

5. The memory device according to claim 1, wherein:
   the first command is input after the first active command, and
   the second command is input after the first command and a second active command.

6. The memory device according to claim 1, wherein the second command is a read command.

7. The memory device according to claim 1, further comprising:
   a reset circuit configured to reset the first signal when a precharge command is input.

8. The memory device according to claim 1, wherein:
   the memory area includes a plurality of memory cells, and
   each of the memory cells includes a magnetoresistive effect element.

9. A method for controlling a memory device, comprising:
   reading out data from a memory area without outputting the data to a data line if a first command is received;
   outputting the data to the data line if a second command is received after the first command is received;
   outputting the data stored in the memory area to the data line if the second command is received without receiving the first command;
   selecting a first latency if the first command is received after a first signal is reset;
   selecting a second latency if the second command is received after the first signal is reset;
   writing data in the memory area after the selected second latency if a write command is input;
   storing data read out from the memory area in a storage unit; and
   outputting the data externally if the second command is input, after the selected first latency.

10. The method according to claim 9, further comprising:
    selecting a row using a row decoder without selecting a column using a column decoder if the first command is received; and
    selecting the column using the column decoder and the row using the row decoder if the second command is received.

11. The method according to claim 9, wherein the memory area is divided into a plurality of memory banks,
    the method further comprising:
    storing data read out from a predetermined memory bank in the storage unit without outputting the data to the data line if the first command which is associated with the predetermined memory bank is received; and
    outputting the data stored in the memory area or the storage unit to the data line if the second command which is associated with the predetermined memory bank is received.

12. The method according to claim 9, wherein:
    in the storing, if the first command is received, data of a page read out from the memory area are stored in the storage unit without outputting the data to the data line, and
    in the outputting, if the second command is received, some of the data of the page stored in the memory area or the storage unit are output to the data line.

13. The method according to claim 9, wherein;
the first command is issued after a first active command, and
the second command is issued after the first command and a second active command.

14. The method according to claim 9, wherein the second command is a read command.

15. The method according to claim 9, further comprising:
resetting the first signal when a precharge command is input.

16. The method according to claim 9, wherein:
the memory area includes a plurality of memory cells, and each of the memory cell includes a magnetoresistive effect element.

17. A memory device comprising:
a memory area;
a control circuit configured to (i) read out data from the memory area, if a first command is received after an active command is received, and (ii) subsequently, output the data to the data line if a second command is received;
a latency selection circuit configured to select a first latency if the first command is received after a first signal is reset, select a second latency if the second command is received after the first signal is reset, and prevent the selection from being changed until the first signal is reset if one of the first latency and the second latency is selected; and
a storage unit configured to store the data read out from the memory area,
wherein:
if the second command is input, the control circuit outputs the data from the memory area or the storage unit to the data line after the selected first latency, and
if a write command is input, the control circuit writes data in the memory area after the selected second latency.

18. The device according to claim 17, further comprising:
a row decoder selecting a row in the memory area; and
a column decoder selecting a column in the memory area,
wherein if the first command is received, the control circuit selects the row using the row decoder, and selects no column using the column decoder, and
if the second command is received, the control circuit selects the row using the row decoder, and selects the column using the column decoder.

* * * * *